United States Patent
Hu et al.

(10) Patent No.: US 11,005,491 B1
(45) Date of Patent: May 11, 2021

(54) SYSTEM AND METHOD FOR WIRELESS RECEIVER COMMUNICATION BASED ON VARIABLE LEADING BIT ORTHOGONAL CODE SETS

(71) Applicant: HUAWEI TECHNOLOGIES CO., LTD., Guangdong (CN)

(72) Inventors: Lan Hu, Ottawa (CA); Sai Mohan Kilambi, Nepean (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/884,869

(22) Filed: May 27, 2020

(51) Int. Cl.
| | |
|---|---|
| H03M 1/00 | (2006.01) |
| H03M 1/36 | (2006.01) |
| H04B 1/12 | (2006.01) |
| H04J 13/00 | (2011.01) |
| H04L 27/26 | (2006.01) |
| H04B 7/212 | (2006.01) |
| H04L 1/06 | (2006.01) |

(52) U.S. Cl.
CPC ............ *H03M 1/361* (2013.01); *H04B 1/123* (2013.01); *H04B 7/2125* (2013.01); *H04J 13/004* (2013.01); *H04L 1/0668* (2013.01); *H04L 27/2698* (2013.01)

(58) Field of Classification Search
CPC .............................. H03M 1/161; H04B 7/2125
USPC .................. 341/155, 144, 120, 118, 160, 110
See application file for complete search history.

(56) References Cited

U.S. PATENT DOCUMENTS

| | | | |
|---|---|---|---|
| 9,391,631 B1* | 7/2016 | Thompson | H04J 13/18 |
| 10,790,936 B1* | 9/2020 | Mansour | H04L 1/0631 |

* cited by examiner

*Primary Examiner* — Peguy Jean Pierre
(74) *Attorney, Agent, or Firm* — BCF LLP

(57) ABSTRACT

The disclosed systems, structures, and methods are directed to a wireless receiver. The configurations presented herein employ a signal encoder configured to encode a plurality of received analog signals into a single encoded analog composite signal, in accordance with a variable leading bit orthogonal coding scheme, an analog-to-digital converter (ADC) configured to convert the single encoded analog composite signal into a single encoded digital composite signal containing constituent digital signals, a synchronization module configured to provide the variable leading bit orthogonal coding scheme to the signal encoder, and a signal decoder configured to decode the single encoded digital composite signal in accordance with the variable leading bit orthogonal coding scheme, to output a plurality of digital signals containing the desired information content of the received plurality of analog signals.

22 Claims, 23 Drawing Sheets

SYSTEM AND METHOD FOR WIRELESS RECEIVER COMMUNICATION BASED ON VARIABLE LEADING BIT ORTHOGONAL CODE SETS

CROSS-REFERENCE TO RELATED APPLICATIONS

This is the first application filed for the instantly disclosed technology.

FIELD OF THE INVENTION

The present invention generally relates to the field of wireless communication system and, in particular, to systems and methods for wireless receiver communication based on variable leading orthogonal code sets.

BACKGROUND

Various wireless communication systems are configured to receive multiple analog signals that have been previously encoded and modulated. These multiple analog signals may then be combined using a code having a higher frequency than the modulation frequency of the analog signals. This combination of analog signals yields an output signal that is spread across a wide bandwidth. The use of high code rates to spread the data signals enables the sharing of receiver hardware resources by combining multiple input signals to a single signal before being sampled by analog-to-digital (ADC) converter, while also providing a greater resistance to interference as well as promoting increased reliability (e.g., lower error vector magnitude (EVM) values).

However, it will be appreciated that the encoding of multiple analog signals at a higher code rate presents certain challenges to wireless receiver systems. One such challenge is that such receiver systems need to employ hardware, software, and firmware elements that are capable of operating at higher speeds to properly process the high code rate signals.

These challenges may be exacerbated by certain proposed enhancements to existing wireless communication systems as well as next-generation wireless communication designs. Such enhancements and designs include the deployment of high speed encoder, high sampling rate ADCs to sample high code rate signals, etc. Such enhancements and designs potentially strain the receiver hardware and software processing resources that are currently implemented.

SUMMARY

An object of the present disclosure is to provide a method of processing wireless received signals, comprising receiving a plurality of analog signals, encoding the plurality of received analog signals into a single encoded analog composite signal in accordance with a variable leading bit orthogonal coding scheme, converting the single encoded analog composite signal into a single encoded digital composite signal containing constituent digital signals, and decoding the single encoded digital composite signal containing constituent digital signals in accordance with the variable leading bit orthogonal coding scheme, to output a plurality of digital signals containing the desired information content of the received plurality of analog signals.

In accordance with other aspects of the present disclosure, the method, wherein a leading bit in the variable leading bit orthogonal coding scheme is programmable.

In accordance with other aspects of the present disclosure, the method, wherein except for the leading bit remaining variable leading bit orthogonal coding scheme is orthogonal in nature.

In accordance with other aspects of the present disclosure, the method, further comprising performing offline synchronization.

In accordance with other aspects of the present disclosure, the method, wherein performing the offline synchronization further comprises masking the orthogonal codes in the variable leading bit orthogonal coding scheme, adjusting a delay of a clock signal for converting the single encoded analog composite signal into the single encoded digital composite signal, adjusting a delay of the single encoded digital composite signal, detecting the leading bit in the single encoded digital composite signal, measuring a power associated with the detected bit, and if the power associated with the detected bit is more than a pre-defined threshold, unmasking the orthogonal codes in the variable leading bit orthogonal coding scheme, if the power associated with the detected bit is less than the predefined threshold, again adjusting the delay of the clock signal and of the single encoded digital composite signal.

In accordance with other aspects of the present disclosure, the method, wherein the delay adjustment of the clock signal is by a fractional factor.

In accordance with other aspects of the present disclosure, the method, wherein the delay adjustment of the single encoded digital composite signal is by an integer factor.

In accordance with other aspects of the present disclosure, the method, wherein the delay adjustment of the single encoded digital composite signal is by a fractional factor.

In accordance with other aspects of the present disclosure, the method, further comprising performing an online synchronization.

In accordance with other aspects of the present disclosure, the method, wherein performing the online synchronization further comprises programming the leading bit value greater than the current value in the variable leading bit orthogonal coding scheme, adjusting a delay of a clock signal for converting the single encoded analog composite signal into the single encoded digital composite signal, adjusting a delay of the single encoded digital composite signal, detecting the leading bit in the single encoded digital composite signal, measuring a power associated with the detected bit, and if the power associated with the detected bit is more than a pre-defined threshold, reprogramming the leading bit value to the previous value in the variable leading bit orthogonal coding scheme, if the power associated with the detected bit is less than the predefined threshold, again adjusting the delay of the clock signal and of the single encoded digital composite signal.

In accordance with other aspects of the present disclosure, the method, wherein the delay adjustment of the clock signal is by a fractional factor.

In accordance with other aspects of the present disclosure, the method, wherein the delay adjustment of the single encoded digital composite signal is by an integer factor.

In accordance with other aspects of the present disclosure, the method, wherein the delay adjustment of the single encoded digital composite signal is by a fractional factor.

Another object of the present disclosure is to provide a wireless receiver, comprising a signal encoder configured to encode a plurality of received analog signals into a single encoded analog composite signal, in accordance with a variable leading bit orthogonal coding scheme, an analog-to-digital converter (ADC) configured to convert the single encoded analog composite signal into a single encoded digital composite signal containing constituent digital signals, a synchronization module configured to provide the variable leading bit orthogonal coding scheme to the signal encoder, and a signal decoder configured to decode the single encoded digital composite signal in accordance with the variable leading bit orthogonal coding scheme, to output a plurality of digital signals containing the desired information content of the received plurality of analog signals.

In accordance with other aspects of the present disclosure, the wireless receiver, wherein a leading bit in the variable leading bit orthogonal coding scheme is programmable.

In accordance with other aspects of the present disclosure, the wireless receiver, wherein except for the leading bit remaining variable leading bit orthogonal coding scheme is orthogonal in nature.

In accordance with other aspects of the present disclosure, the wireless receiver, wherein the synchronization module, further comprises a variable leading bit orthogonal code set generator configured to generate the variable leading bit orthogonal coding scheme, a control module configured to program the leading bit in the variable leading bit orthogonal coding scheme, a delay module configured to adjust a delay of clock signal generated by a clock generator and provide the delay to the ADC, in accordance with input from the control module, a masking module configured to mask the orthogonal codes in the variable leading bit orthogonal coding scheme, and a leading bit analyzer configured to detect and process the leading bit in the variable leading bit orthogonal coding scheme.

In accordance with other aspects of the present disclosure, the wireless receiver, wherein the control module is further configured to provide a code type and code rate to the variable leading bit orthogonal code set generator for generating the variable leading bit orthogonal coding scheme.

In accordance with other aspects of the present disclosure, the wireless receiver, further comprising performing offline synchronization.

In accordance with other aspects of the present disclosure, the wireless receiver, wherein performing the offline synchronization further comprises masking, by the masking module, the orthogonal codes in the variable leading bit orthogonal coding scheme, adjusting, by the delay module, a delay of a clock signal for converting the single encoded analog composite signal into the single encoded digital composite signal, adjusting, by the leading bit analyzer, a delay of the single encoded digital composite signal, detecting, by the leading bit analyzer, the leading bit in the single encoded digital composite signal, measuring, by the leading bit analyzer a power associated with the detected bit, and if the power associated with the detected bit is more than a pre-defined threshold, unmasking, by the masking module, the orthogonal codes in the variable leading bit orthogonal coding scheme, if the power associated with the detected bit is less than the predefined threshold, again adjusting, by the delay module, the delay of the clock signal and again adjusting, by the leading bit analyzer, the delay of the single encoded digital composite signal.

In accordance with other aspects of the present disclosure, the wireless receiver, further comprising performing an online synchronization.

In accordance with other aspects of the present disclosure, the wireless receiver, wherein performing the online synchronization further comprises programming, by the control module, the leading bit value greater than the current value in the variable leading bit orthogonal coding scheme, adjusting, by the delay module, a delay of a clock signal for converting the single encoded analog composite signal into a single encoded digital composite signal, adjusting, by the leading bit analyzer, a delay of the single encoded digital composite signal, detecting, by the leading bit analyzer, the leading bit in the single encoded digital composite signal, measuring, by the leading bit analyzer a power associated with the detected bit, and if the power associated with the detected bit is more than a pre-defined threshold, unmasking, by the masking module, the orthogonal codes in the variable leading bit orthogonal coding scheme, if the power associated with the detected bit is less than the predefined threshold, again adjusting, by the delay module, the delay of the clock signal and again adjusting, by the leading bit analyzer, the delay of the single encoded digital composite signal.

BRIEF DESCRIPTION OF THE FIGURES

The features and advantages of the present disclosure will become apparent from the following detailed description, taken in combination with the appended drawings, in which.

Figure 1:
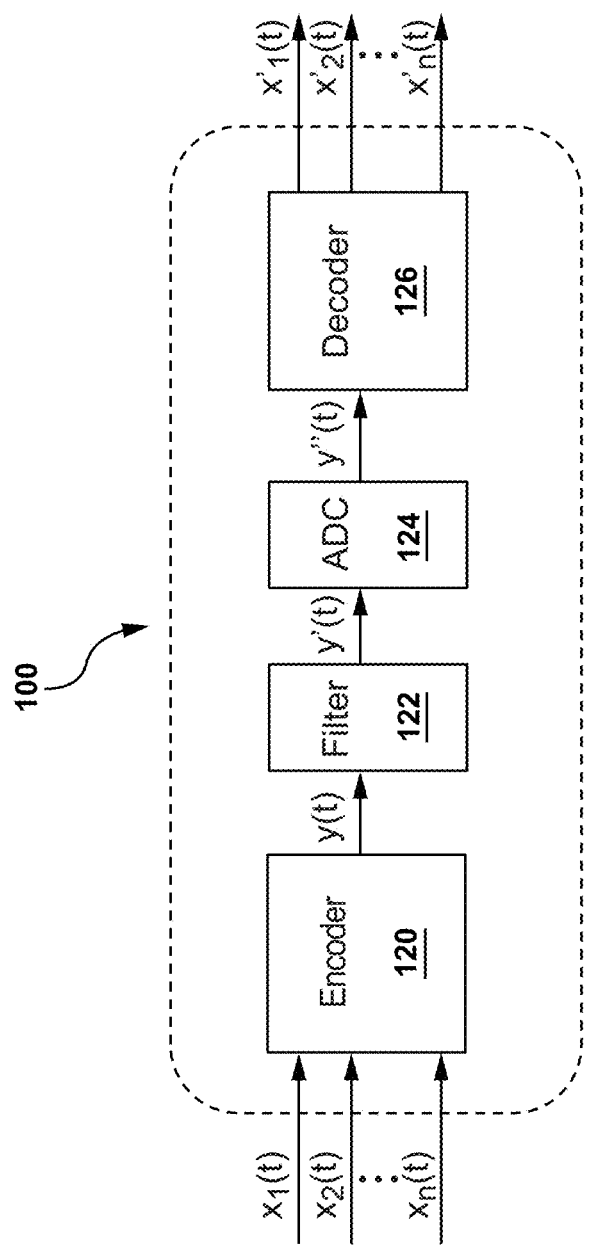
FIG. 1(Prior Art) depicts a high-level functional block diagram of a conventional wireless communication receiver.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Unless otherwise defined, all technical and scientific terms used herein have the same meaning as commonly understood by one of ordinary skill in the art to which the described embodiments appertain.

All statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes which may be substantially represented in computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules or units which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

With these fundamentals in place, we will now consider some non-limiting examples to illustrate various implementations of aspects of the present disclosure FIG. 1 illustrates a functional block diagram of a conventional wireless receiver 100 directed to processing received analog signals. The conventional wireless receiver 100 includes an encoder module 120, an anti-aliasing filter 122, an analog-to-digital converter (ADC) 124, and a decoder module 126. Other elements may be present but not illustrated for purposes of tractability and simplification.

As illustrated by FIG. 1, conventional wireless receiver 100 receives n analog input signals $x_1(t)$, $x_2(t) \ldots x_n(t)$, which may be received by one or more antenna structures (not shown), such as, for example, MIMO/M-MIMO antennas. It will be understood that each of the received signals may possess different modulation/encoding characteristics.

As shown, the n analog input signals $x_1(t)$, $x_2(t) \ldots x_n(t)$ are forwarded to encoder module 120. Encoder module 120 is configured to encode and convert the n analog input signals $x_1(t)$, $x_2(t) \ldots x_n(t)$ into a single encoded analog composite signal y(t). Signal y(t) is encoded at a rate higher than the rate of any of the n analog input signals $x_1(t)$, $x_2(t) \ldots x_n(t)$, in accordance with a spread-coding scheme implemented by encoder module 120.

In particular, the encoding operation of encoder module 120 is accomplished by mixing the analog input signals $x_1(t)$, $x_2(t) \ldots x_n(t)$ with a spread-coding scheme. The outputs of the mixing operation may be subsequently combined to yield the single encoded analog composite signal y(t).

It will be appreciated that the spread-coding scheme may be based on any number of different types of codes such as orthogonal codes or pseudo-noise PN sequences such as, for example, Walsh, Hadamard, Gold, Barker codes, etc. These codes exhibit desirable coding characteristics and may be implemented at a substantially higher frequency rate than the rates of received analog input signals $x_1(t)$, $x_2(t) \ldots x_n(t)$. In so doing, encoder module 120 outputs the single encoded analog composite signal y(t) that is effectively spread across a wide frequency bandwidth.

As illustrated in FIG. 1, the single encoded analog composite signal y(t) may be provided to the anti-aliasing filter 122 to attenuate the higher frequencies components and prevent the aliasing components from being sampled. The anti-aliasing filter 122 may comprise a low-pass filter or a band-pass filter with suitable cut-off frequencies. By having the single encoded analog composite signal y(t) output by encoder 120, only a single anti-aliasing filter 122 is needed, instead of having a plurality of input signals $x_1(t)$, $x_2(t) \ldots x_n(t)$ requiring a corresponding plurality of filters.

The filtered, encoded analog composite signal y'(t) may then be supplied to a high bandwidth analog-to-digital converter ADC 124, which operates to convert the filtered version of analog composite signal y'(t) into a single encoded digital composite signal y"(t).

The single encoded digital composite signal y'(t) may then be subsequently transmitted for further processing, such as, for example, decoding operations performed by decoder module 126. The decoder module 126 processes the single encoded digital composite signal y'(t) to decode and separate the single encoded digital composite signal y'(t) into constituent n digital signals $x'_1(t), x'_2(t) \ldots x'_n(t)$ that encompass the desired information contained by the originally received n analog input signals.

In particular, decoder module 126 receives and processes the single encoded digital composite signal y'(t) by mixing the single encoded digital composite signal y'(t) with the same spread-coding scheme at the same rate as that was used in encoder 120 in the encoding of the originally received analog input signals $x_1(t), x_2(t) \ldots x_n(t)$. The resulting mixed samples may be then integrated to generate n digital signals $x'_1(t), x'_2(t) \ldots x"(t)$.

As noted above, wireless receiver 100 requires hardware and software processes, such as, for example, the encoder 120, ADC 122 and other components, to operate at high processing speeds to accommodate the processing of the encoded, high-rate, wideband signals.

Figure 2:
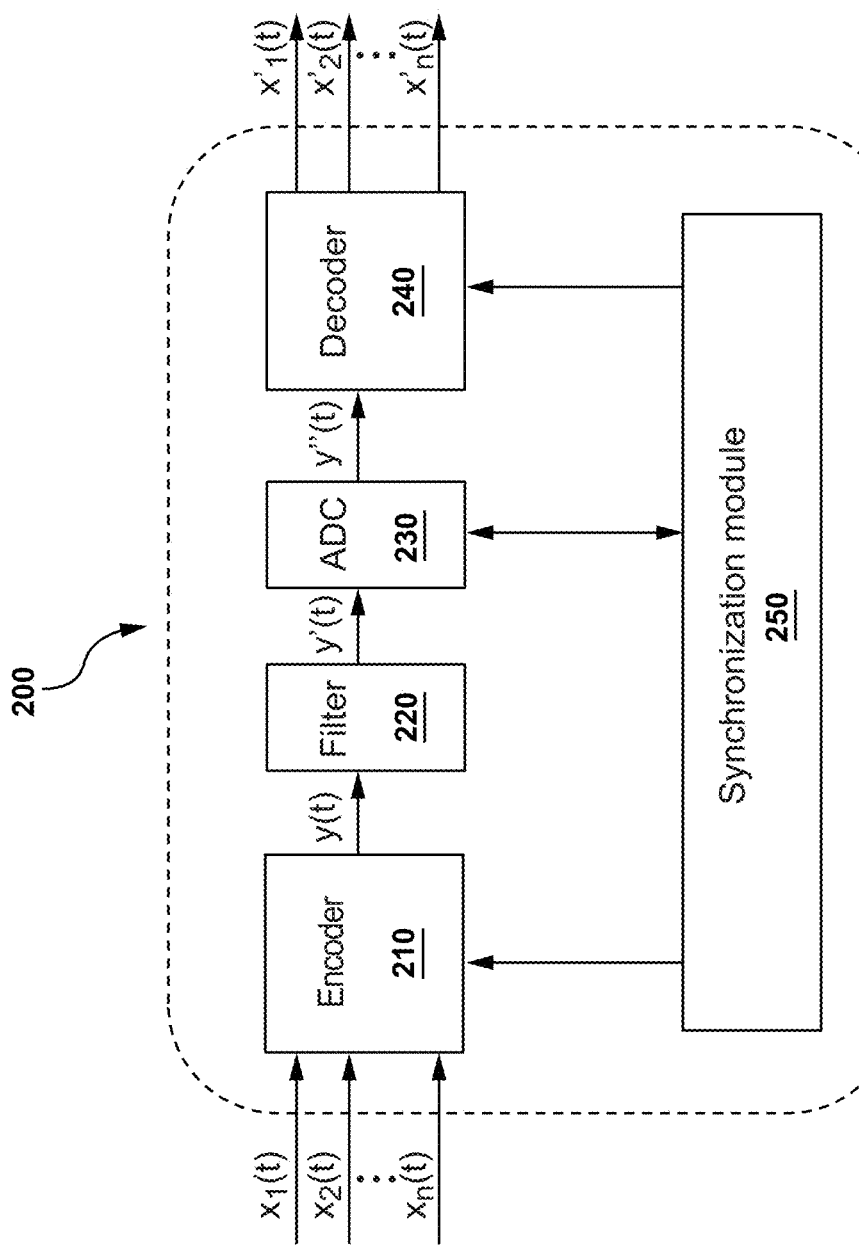
FIG. 2 depicts a high-level functional block diagram of a representative variable-rate decoder-based wireless receiver, in accordance with various embodiments of the present disclosure.

FIG. 2 depicts a functional block diagram of a wireless receiver 200, in accordance with various embodiments of the present disclosure. As shown, the wireless receiver 200 employs a encoder 210, an anti-aliasing filter 220, an ADC 230, and a decoder 240, and a synchronization module 250. Other elements may be present but not illustrated for purposes of tractability and simplicity.

As will be understood in view of the ensuing descriptions and, in accordance with various embodiments of the present disclosure, the implementation of the synchronization module 250 in conjunction with other components of the wireless receiver 200 operates to effectively reduce high encoding rate requirements and performing efficient synchronization between the encoder 210 and the decoder 240 while maintaining data recovery integrity. In so doing, the wireless receiver 200 may be implemented with a substantially relaxed requirements for hardware/software processing speeds, power consumption and bandwidth required to otherwise accommodate the processing of the encoded, high-rate, wide-band signals.

Moreover, consistent with various embodiments of the present disclosure, it will be appreciated that some or all of the noted elements of the wireless receiver 200, such as, for example, the encoder 210, the anti-aliasing filter 220, the ADC 230, and the decoder 240, and the synchronization module 250, may be implemented by combinations of at least one of software, firmware and either general purpose or dedicated hardware constructs to facilitate integration with existing receivers.

With this said, wireless receiver 200 receives n analog input signals $x_1(t), x_2(t) \ldots x_n(t)$, which may be received by one or more antenna structures (not shown), such as, for example, MIMO/M-MIMO antennas. It will be understood that each of the received signals may possess different modulation/encoding characteristics.

As shown, the n analog input signals $x_1(t), x_2(t) \ldots x_n(t)$ are forwarded to encoder 210. The encoder 210 may be configured to encode and convert the n analog input signals $x_1(t), x_2(t) \ldots x_n(t)$ into a single encoded analog composite signal y(t). In particular, the encoding operation of encoder module 210 may be accomplished by mixing the analog input signals $x_1(t), x_2(t) \ldots x_n(t)$ with a variable leading bit orthogonal code set $c_i[n+1]: c_1[n+1], c_2[n+1], \ldots c_n[n+1]$ as generated by the synchronization module 250. The outputs of the mixing operation may be subsequently combined to yield the single encoded analog composite signal y(t).

The single encoded analog composite signal y(t) may be provided to the anti-aliasing filter 220 to attenuate the higher frequencies components and prevent the aliasing components from being sampled. The anti-aliasing filter may comprise a low-pass filter or a band-pass filter with suitable cut-off frequencies. By having the single encoded analog composite signal y(t) output by encoder 210, only a single anti-aliasing filter 220 is required, instead of having a plurality of input signals $x_1(t), x_2(t) \ldots x_n(t)$ requiring a corresponding plurality of filters.

The filtered, single encoded analog composite signal y'(t) may then be supplied to the ADC 230, which operates to convert the filtered single encoded analog composite signal y'(t) into a single encoded digital composite signal y"(t).

The single encoded digital composite signal y'(t) may then be subsequently transmitted for further processing, such as, for example, decoding operations performed by decoder module 240. The decoder module 240 processes the single encoded digital composite signal y"(t) to decode and separate the single encoded digital composite signal y"(t) into constituent n digital signals $x'_1(t), x'_2(t) \ldots x'_n(t)$ that encompass the desired information contained by the originally received n analog input signals.

In particular, decoder module 240 receives and processes the single encoded digital composite signal y"(t) by mixing the single encoded digital composite signal y"(t) with the same variable leading bit orthogonal code set $c_i[n+1]: c_1[n+1], c_2[n+1], \ldots c_n[n+1]$ at the same rate as that was used in encoder 120 in the encoding of the originally received analog input signals $x_1(t), x_2(t) \ldots x_n(t)$. The resulting mixed samples may be then integrated to generate n digital signals $x'_1(t), x'_2(t) \ldots x'_n(t)$.

Figure 3:
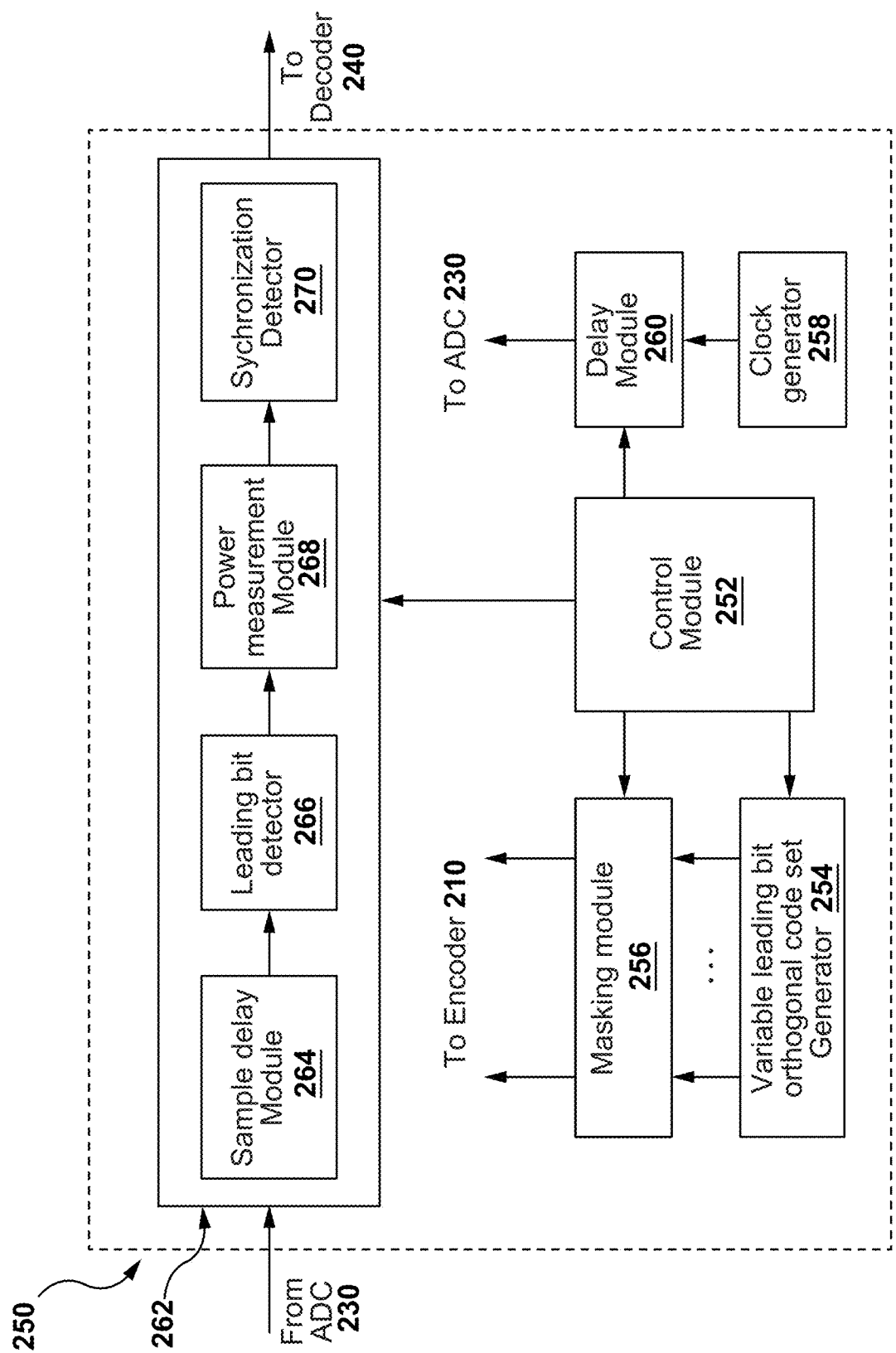
FIG. 3 illustrates a detailed high-level functional block diagram of a synchronization module, in accordance with various embodiments of the present disclosure.

FIG. 3 illustrates a detailed high-level functional block diagram of the synchronization module 250, in accordance with various embodiments of the present disclosure. As shown, the synchronization module 250 may employ a control module 252, a variable leading bit orthogonal code set generator 254, a masking module 256, a clock generator 258, a delay module 260, and a leading bit analyzer 262. The leading bit analyzer 262 further employs a sample delay module 264, a leading bit detector 266, a power measurement module 268, and a synchronization detector 270. It is to be noted that other elements may be present but not illustrated for purposes of tractability and simplicity.

Figure 4:
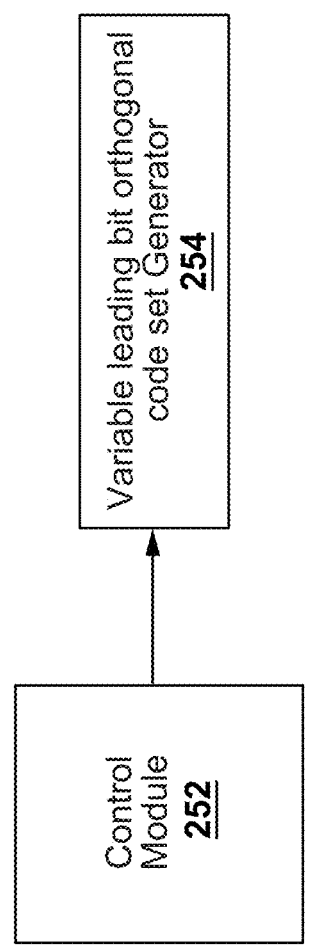
FIG. 4 illustrates a high-level functional block diagram for generating variable leading bit orthogonal code set, in accordance with various embodiments of the present disclosure.

The control module 252 may control the functionality of various components in the synchronization module 250, such as the variable leading bit orthogonal code set generator 254, the masking module 256, the delay module 260, and the leading bit detector 266. In certain embodiments, the control module 252 may assist the variable leading bit orthogonal code set generator 254 to generate variable leading bit orthogonal code set $c_i[n+1]: c_1[n+1], c_2[n+1], \ldots c_n[n+1]$. As shown, FIG. 4 illustrates a high-level functional block diagram for generating the variable leading bit orthogonal code set, in accordance with various embodiments of the present disclosure.

The structure of variable leading bit orthogonal code set $c_i[n+1]: c_1[n+1], c_2[n+1], \ldots c_n[n+1]$ may be defined as:

$$c_i[n+1] = [L_{n \times 1} \text{ORTH}_{n \times n}]$$

where $L_{n\times 1}$ may be a n×1 variable leading bit matrix leading the n×n orthogonal code set $ORTH_{n\times n}$ and n be the number of codes and length of each orthogonal code in orthogonal code set $ORTH_{n\times n}$, and i may varies from $1\le i\le n$. Further, the control module 252 may be configured to program leading bit matrix $L_{n\times 1}$, select a code type and a code rate, in accordance with the requirements associated with the wireless receiver 200. It is to be noted that except for the variable leading bit L in the variable leading bit orthogonal code set $c_i[n+1]$ remaining code is orthogonal in nature.

In certain embodiments, the value of n may be even or odd. As an example, when n is even, the $ORTH_{n\times n}$ may be based on hadamard orthogonal code matrix and zero matrix which may be defined as:

$$ORTH_{n\times n} = \begin{bmatrix} H_{\frac{n}{2}\times\frac{n}{2}} & O_{\frac{n}{2}\times\frac{n}{2}} \\ O_{\frac{n}{2}\times\frac{n}{2}} & H_{\frac{n}{2}\times\frac{n}{2}} \end{bmatrix}$$

Where H is a hadamard matrix of size $$\frac{n}{2}\times\frac{n}{2}.$$

Since, the lowest order of hadamard orthogonal code matrix is two, the value of n in this particular case may be equal to four and O is a zero matrix of size $$\frac{n}{2}\times\frac{n}{2}.$$

Also, in case when the value of n is odd, the $ORTH_{n\times n}$ may be defined as:

$$ORTH_{n\times n} = D_{n\times n}$$

Where $D_{n\times n}$ is a scale matrix (A square diagonal matrix with all equal diagonal entries). As an example, the $D_{n\times n}$ may be represented as:

$$D_{n\times n} = \begin{bmatrix} \lambda & 0 & 0 \\ 0 & \lambda & 0 \\ 0 & 0 & \lambda \end{bmatrix}$$

The value of λ may be a positive or a negative value. If the value of λ is positive, the variable leading bit $L_{i\times 1}$ in the variable leading bit orthogonal code set $c_i[n+1]$ may be a negative value and if the value of λ is negative, the variable leading bit L may be positive value. In any case, for even or odd value of n the value of variable leading bit L may be within a set [−A, A], where A≥0.

As special case, for negative variable leading bit L, the variable leading bit orthogonal code set $c_i[n+1]$ may be represented as:

$$c_i[n+1] = \begin{bmatrix} L & 1 & 0 & 0 & 0 & 0 \\ L & 0 & 1 & 0 & 0 & 0 \\ L & 0 & 0 & 1 & 0 & 0 \\ L & 0 & 0 & 0 & 1 & 0 \\ L & 0 & 0 & 0 & 0 & 1 \\ L & 0 & 0 & 0 & 0 & \ldots \end{bmatrix}$$

Where L is a negative value between [−A, 0] and |A|≥0.

In another special case, for positive variable leading bit L, the variable leading bit orthogonal code set $c_i[n+1]$ may be represented as:

$$c_i[n+1] = \begin{bmatrix} L & -1 & 0 & 0 & 0 & 0 \\ L & 0 & -1 & 0 & 0 & 0 \\ L & 0 & 0 & -1 & 0 & 0 \\ L & 0 & 0 & 0 & -1 & 0 \\ L & 0 & 0 & 0 & 0 & -1 \\ L & 0 & 0 & 0 & 0 & \ldots \end{bmatrix}$$

Where L is a positive value between [0, A] and |A|≥0.

Since the variable leading bit value L is same for every code within the variable leading bit orthogonal code set $c_i[n+1]$, the variable leading bit orthogonal code set $c_i[n+1]$ may also be used in synchronization between the encoder 210 and the decoder 240. It is to be noted that for better synchronization, the power associated with the variable leading bit L should be high. However, a high power associated with the variable leading bit L may also result in a higher value of peak-to-average ratio (PAPR) associated with codes in the variable leading bit orthogonal code set $c_i[n+1]$. Thereby, the controller module 252 may be configured to program the variable leading bit L in such a manner that the codes in the variable leading bit orthogonal code set $c_i[n+1]$ may be operated with an acceptable value of PAPR and average value (DC value of the codes) while enabling the synchronization capabilities. Table 1 is the representative example of various values of PAPR and DC value for n equals to odd and even corresponding to the various values of the variable leading bit L.

TABLE 1

| Variable leading bit L | n having an ODD value | | n having an even value | |
|---|---|---|---|---|
| | DC, dBc | PAPR, dB | DC, dBc | PAPR, dB |
| 0 | 0 | 9.7 | 0 | 9.7 |
| 0.5 | −8 | 9.7 | −4 | 10.2 |
| 1 | INFINITE | 13 | 3 | 11.2 |
| −0.5 | −8 | 9.7 | −4 | 10 |
| −1 | −INFINITE | 13 | −5 | 11.2 |

It will be appreciated that the variable leading bit orthogonal code set $c_i[n+1]$: $c_1[n+1]$, $c_2[n+1]$, . . . $c_n[n+1]$ may be based on any number of different types of codes such as orthogonal codes or pseudo-noise PN sequences such as, for example, Walsh, Gold, Barker codes, etc.

Figure 5A:
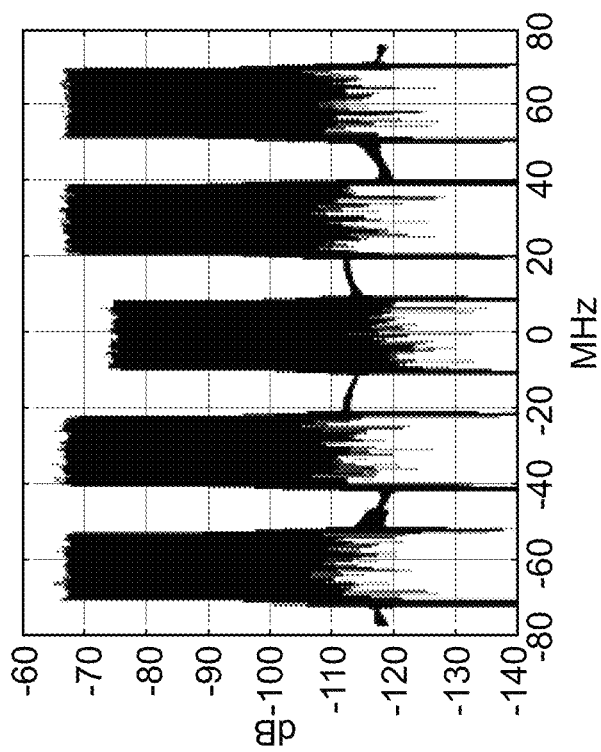
FIGS. 5A-5C illustrate representative simulation results at the output of an encoder when input to the encoder are 4 signals, each having a frequency of 20 MHz, in accordance with various embodiments of present disclosure.
Figure 5B:
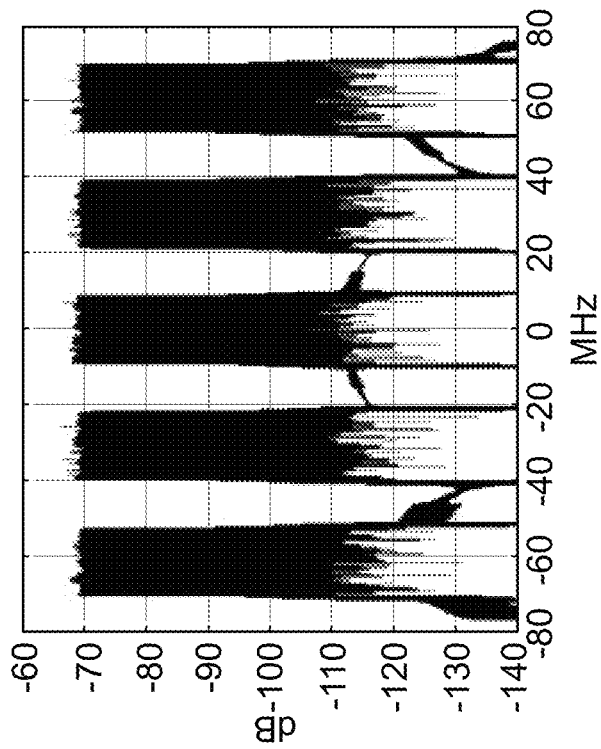
Figure 5C:
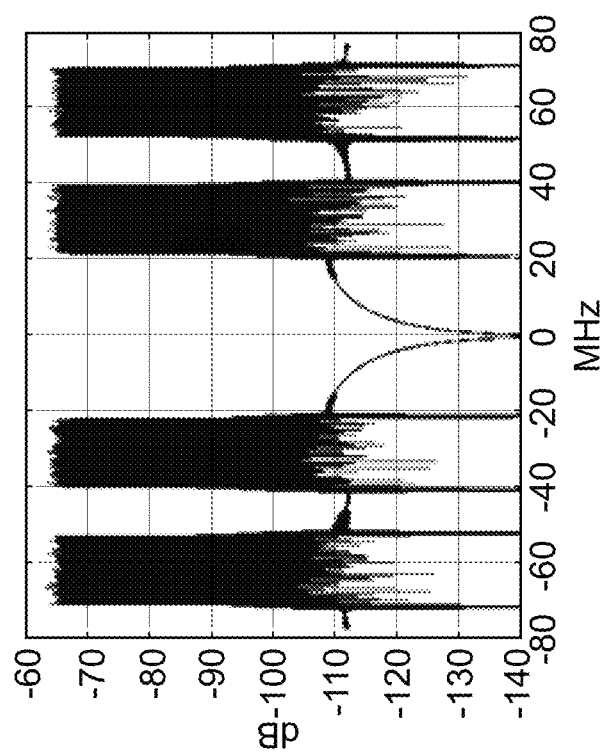

FIGS. 5A-5C illustrate representative simulation results at the output of the encoder 210 when input to the encoder 210 are 4 signals, each having a frequency of 20 MHz, in accordance with various embodiments of present disclosure. Further, the variable leading bit orthogonal code set $c_i[n+1]$ used in this case is based on odd value of n. As shown, FIG.

5A illustrates the output of the encoder 210 for variable leading bit L equals to 0, FIG. 5B illustrates the output of the encoder 210 for variable leading bit L equals to 0.5, and FIG. 5C illustrates the output of the encoder 210 for variable leading bit L equals to 1. It has been observed in FIGS. 5A-5C that with increasing the value of variable leading bit L the DC value decreases.

Figure 6B:
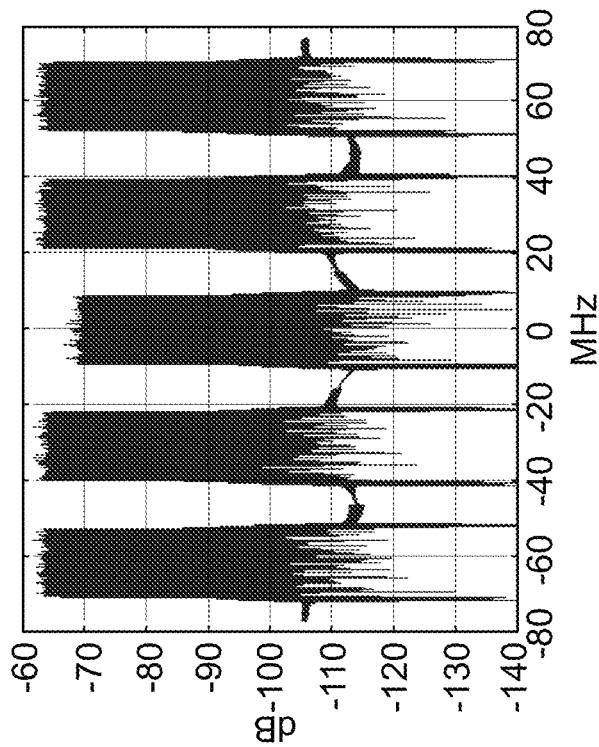
FIGS. 6A-6C illustrate another representative simulation results at the output of an encoder when input to the encoder are 4 signals, each having a frequency of 20 MHz, in accordance with various embodiments of present disclosure.
Figure 6A:
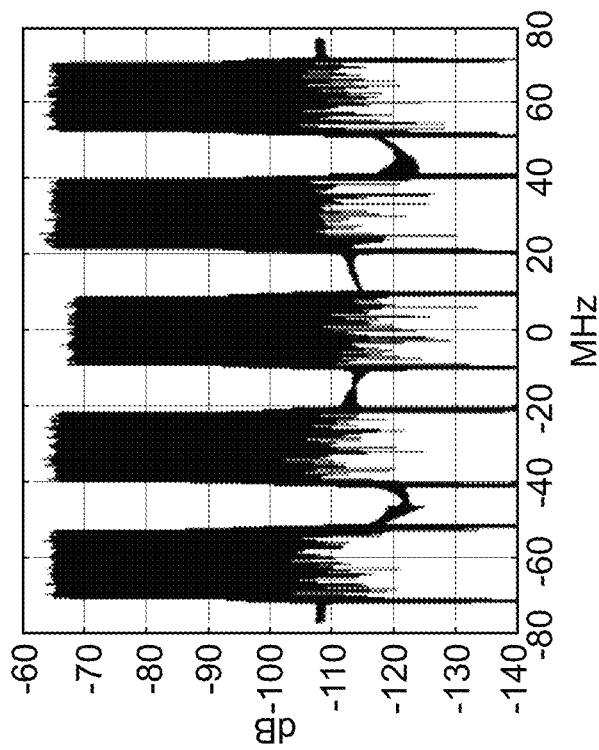
Figure 6C:
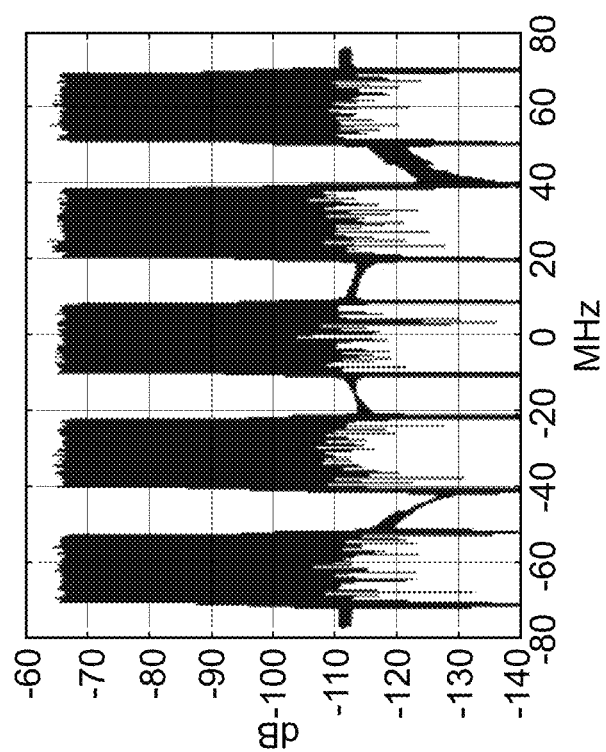

FIGS. 6A-6C illustrate another representative simulation results at the output of the encoder 210 when input to the encoder 210 are 4 signals, each having a frequency of 20 MHz, in accordance with various embodiments of present disclosure. Further, the variable leading bit orthogonal code set $c_i[n+1]$ used in this case is based on even value of n. As shown, FIG. 6A illustrates the output of the encoder 210 for variable leading bit L equals to −1, FIG. 6B illustrates the output of the encoder 210 for variable leading bit L equals to −0.5, and FIG. 6C illustrates the output of the encoder 210 for variable leading bit L equals to 0. It has been observed in FIGS. 6A-6C that with increasing the value of variable leading bit L the DC value increases.

Figure 7A:
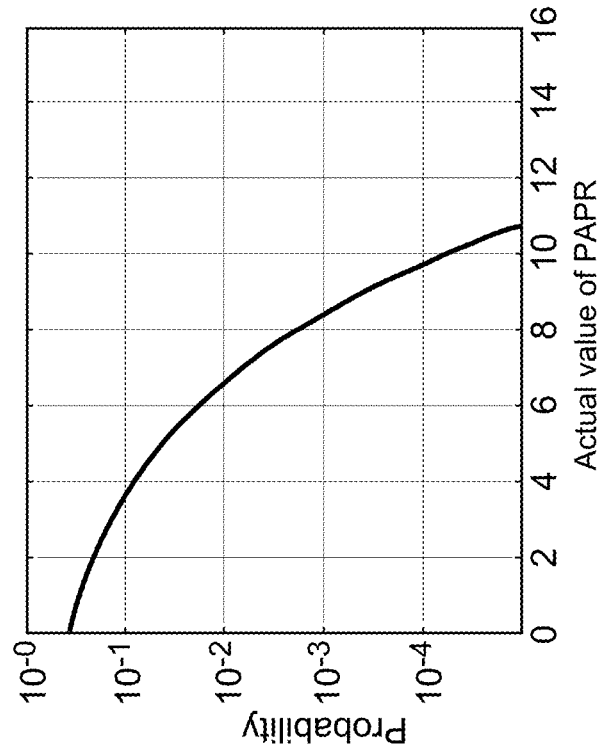
FIGS. 7A-7C illustrate the impact of variable leading bit value L on probability of peak-to-average ratio (PAPR) of the encoded signal at the output of the encoder when input to the encoder are 4 signals, each having a frequency of 20 MHz, in accordance with various embodiments of present disclosure
Figure 7B:
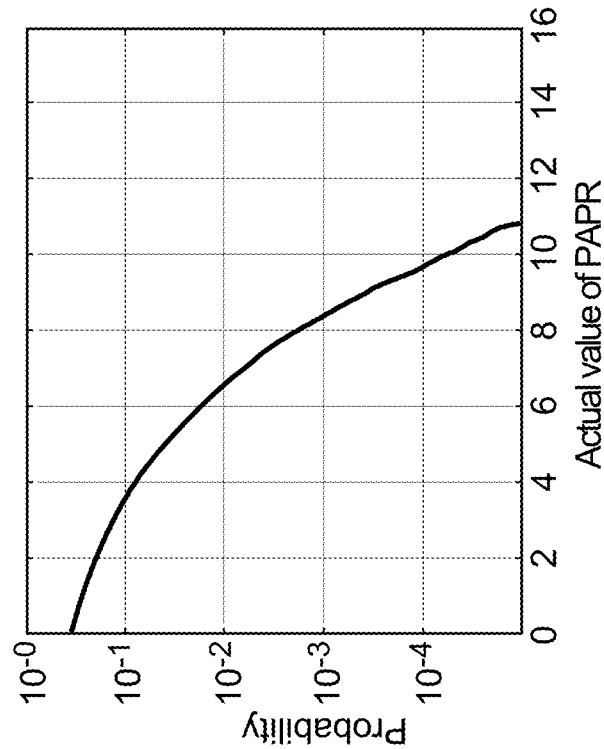
Figure 7C:
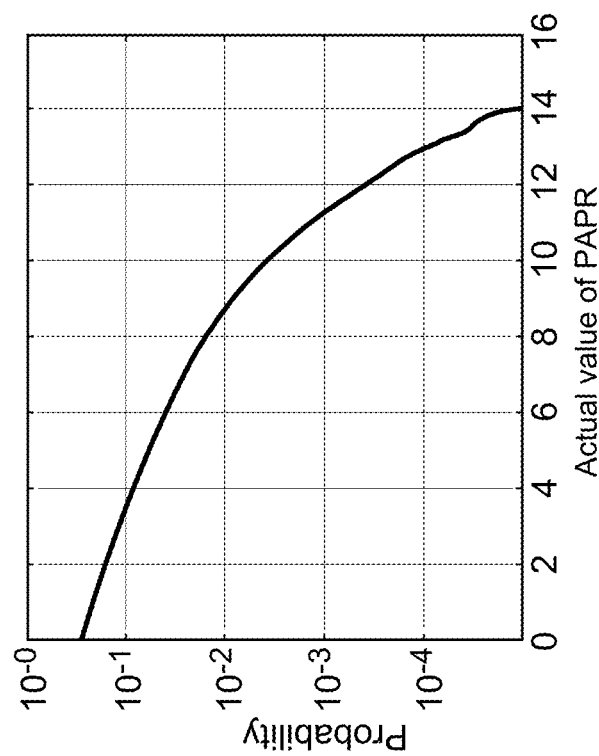

FIGS. 7A-7C illustrate the impact of variable leading bit value L on PAPR of the encoded signal at the output of the encoder when input to the encoder 210 are 4 signals, each having a frequency of 20 MHz, in accordance with various embodiments of present disclosure. Further, the variable leading bit orthogonal code set $c_i[n+1]$ used in this case is based on even value of n. As shown, FIG. 7A illustrates probability of PAPR greater than the actual value of PAPR (on vertical axis) versus the actual value of PAPR (on horizontal axis) for variable leading bit L equals to 0, FIG. 7B illustrates probability of PAPR greater than the actual value of PAPR (on vertical axis) versus the actual value of PAPR (on horizontal axis) for variable leading bit L equals to 0.5, and FIG. 7C illustrates probability of PAPR greater than the actual value of PAPR (on vertical axis) versus the actual value of PAPR (on horizontal axis) for variable leading bit L equals to 1.

Figure 8B:
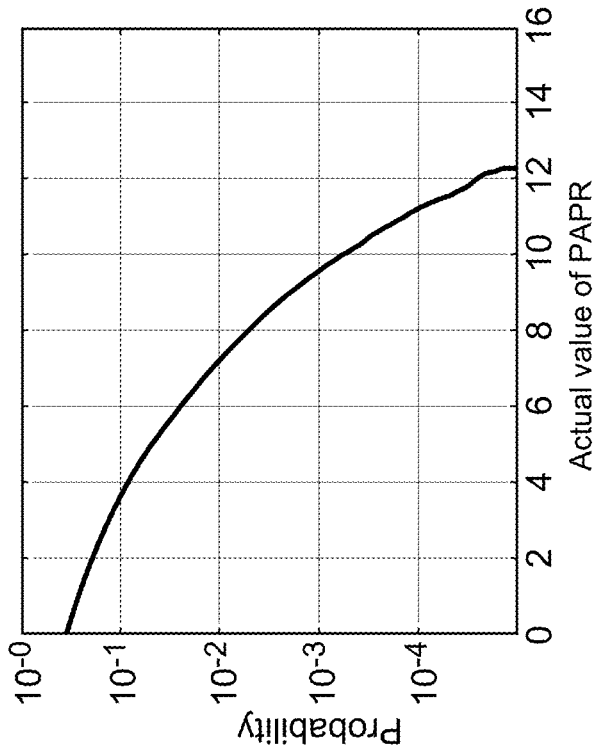
FIGS. 8A-8C illustrate another example to depict the impact of variable leading bit value L on probability of PAPR of the encoded signal at the output of the encoder when input to the encoder are 4 signals, each having a frequency of 20 MHz, in accordance with various embodiments of present disclosure.
Figure 8A:
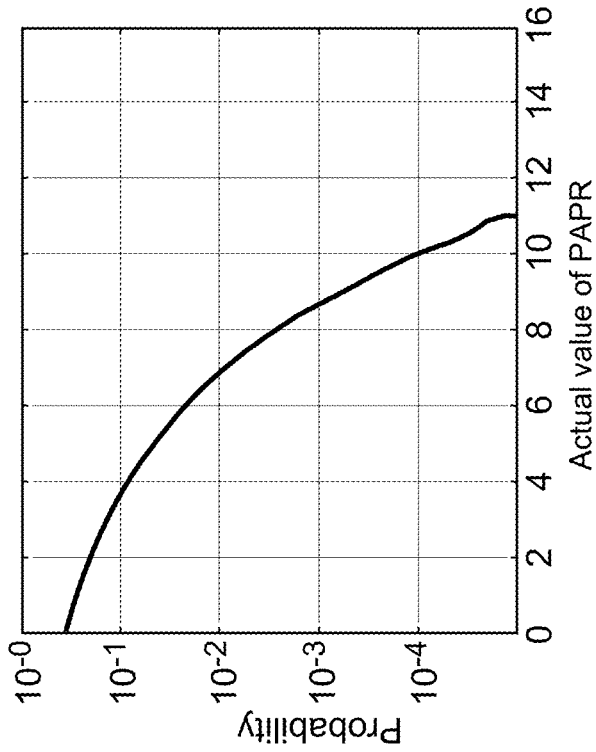
Figure 8C:
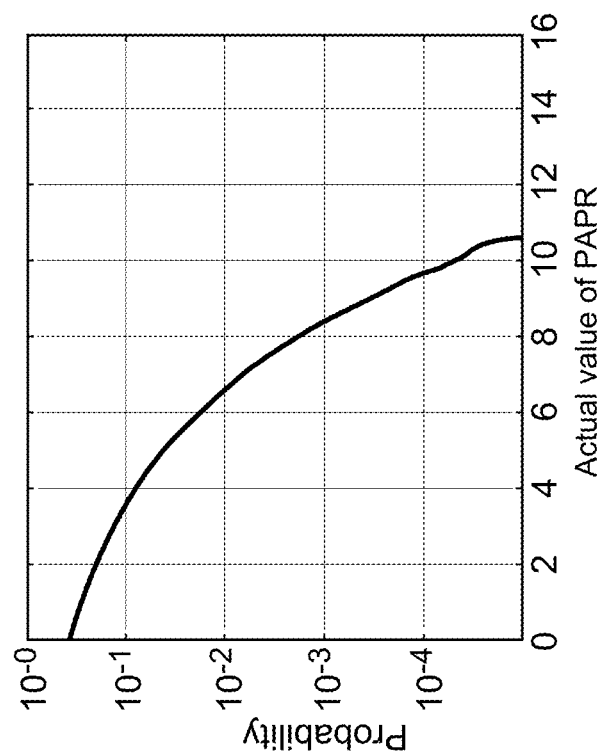

FIGS. 8A-8C illustrate another example to depict the impact of variable leading bit value L on PAPR of the encoded signal at the output of the encoder when input to the encoder 210 are 4 signals, each having a frequency of 20 MHz, in accordance with various embodiments of present disclosure. Further, the variable leading bit orthogonal code set $c_i[n+1]$ used in this case is based on even value of n. As shown, FIG. 8A illustrates probability of PAPR greater than the actual value of PAPR (on vertical axis) versus the actual value of PAPR (on horizontal axis) for variable leading bit L equals to 0, FIG. 8B illustrates probability of PAPR greater than the actual value of PAPR (on vertical axis) versus the actual value of PAPR (on horizontal axis) for variable leading bit L equals to −0.5, and FIG. 8C illustrates probability of PAPR greater than the actual value of PAPR (on vertical axis) versus the actual value of PAPR (on horizontal axis) for variable leading bit L equals to 1.

Figure 9:
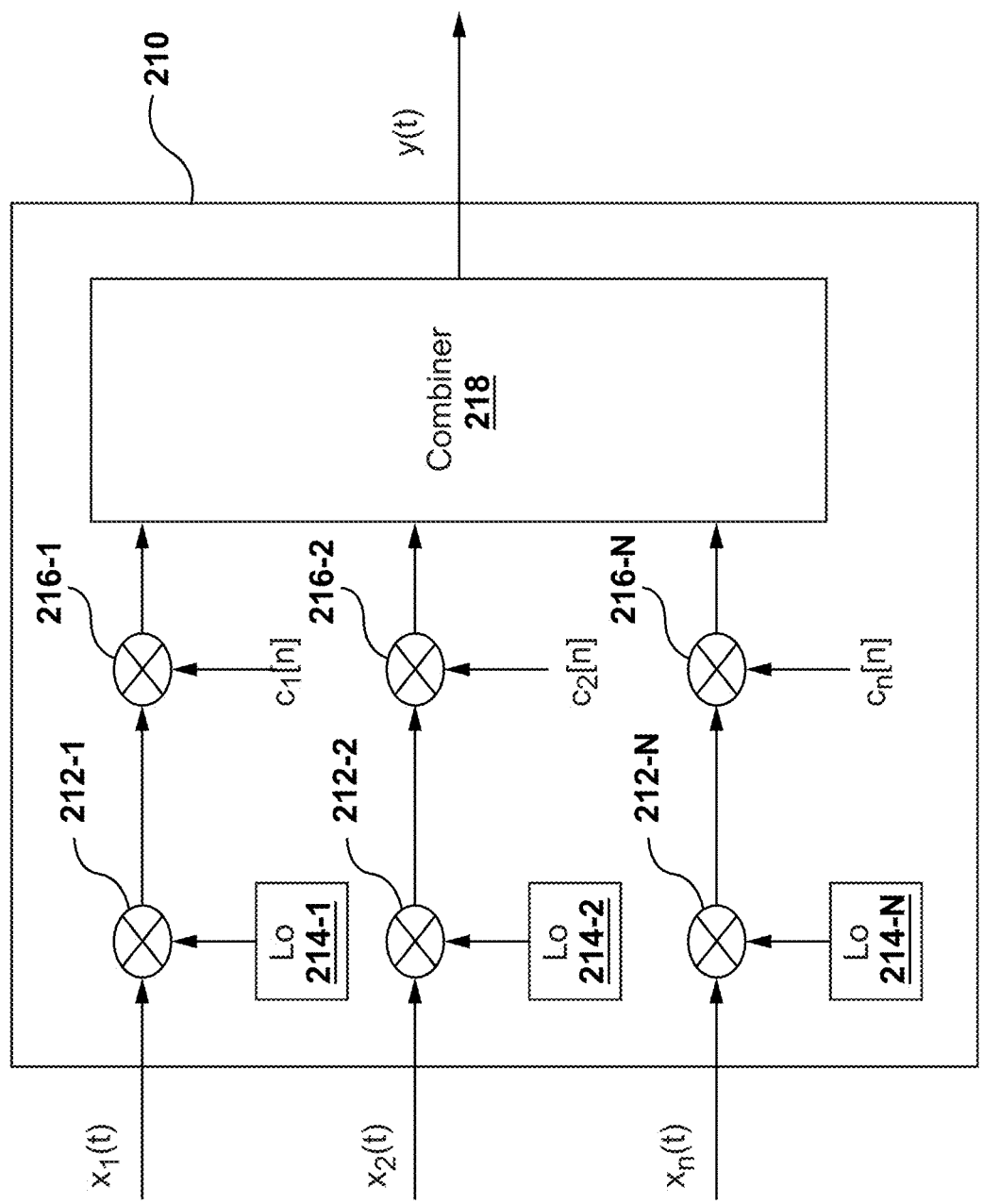
FIG. 9 provides a detailed functional block diagram of the encoder, in accordance with various embodiments of the present disclosure.

FIG. 9 provides a detailed functional block diagram of the encoder 212, in accordance with various embodiments of the present disclosure. As shown, the encoder 212 receives analog input signals $x_1(t), x_2(t) \ldots x_n(t)$. These input signals are forwarded to mixers 212-1, 212-2 . . . 212-N that operate to shift each of the input signals to an intermediate frequency (IF) by mixing the input signals with signals generated by local oscillators 214-1, 214-2 . . . 214-N. In turn, mixers 216-1, 212-6 . . . 216-N operate to mix the IF shifted input signals with the variable leading bit orthogonal code set $c_i[n+1]$: $c_1[n+1], c_2[n+1], \ldots c_n[n+1]$ to spread the shifted input signals. The spreading of each of the input signal expands its bandwidth. The shifted and spread input signals are then forwarded to a combiner 218. The combiner 218 combines the shifted and spread input signals $x_1(t), x_2(t) \ldots x_n(t)$ to yield the single encoded analog composite signal y(t).

Apart from programming the variable leading bit L to operate the variable leading bit orthogonal code set $c_i[n+1]$ with an acceptable value of PAPR and DC value, the controller module 252 may be configured to assist the synchronization module 250 in order to perform synchronization between the encoder 210 and the decode 240.

Figure 10:
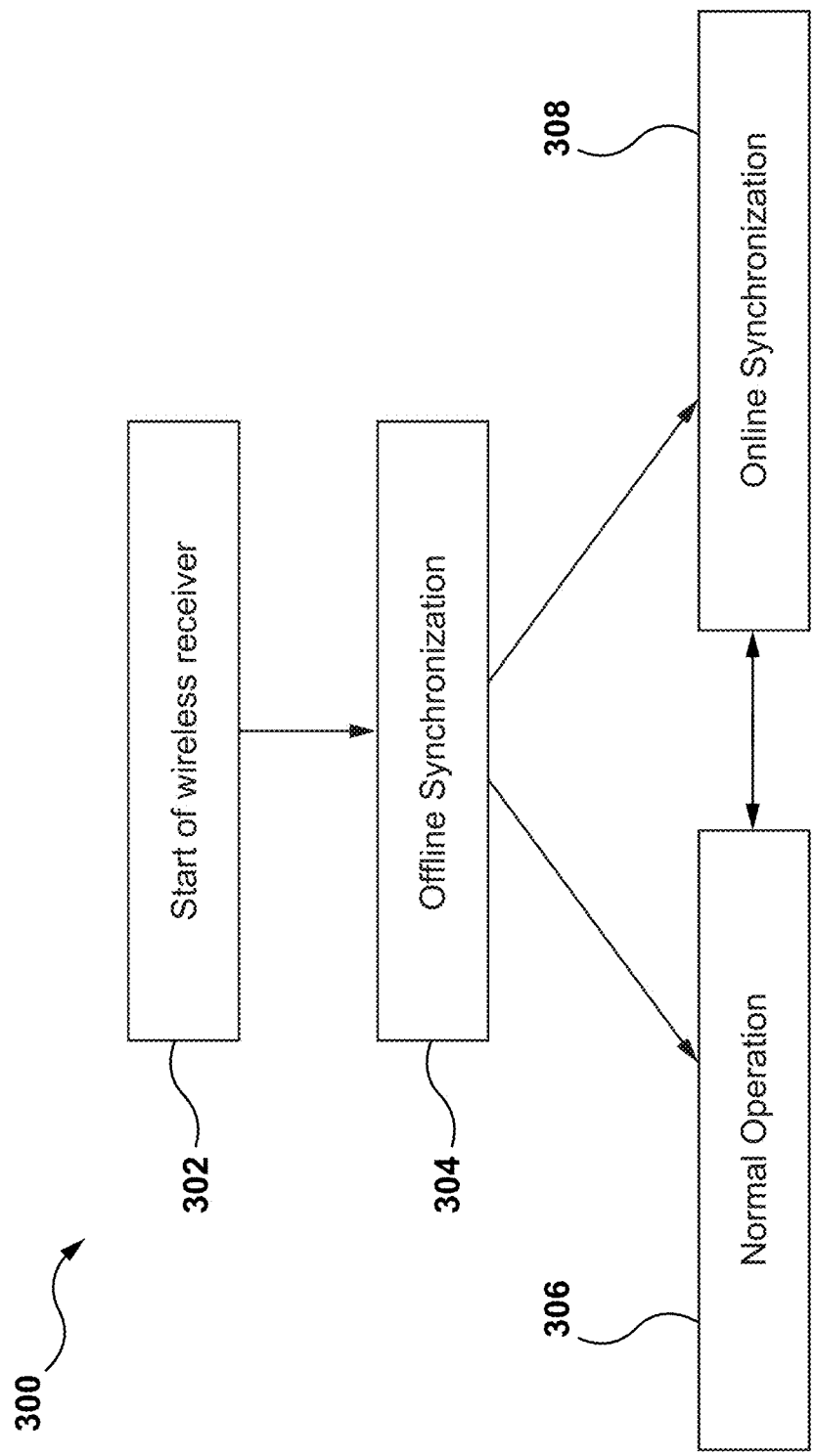
FIG. 10 shows a flow diagram associated with the functionality of the wireless receiver, in accordance with various embodiments of the present disclosure.

FIG. 10 shows a flow diagram of a process 300 associated with the functionality of the wireless receiver 200, in accordance with various embodiments of the present disclosure. As shown, the process 300 begins at task block 302, where the process 300 starts the wireless receiver 200. The process 300 then proceeds to task block 304. At task block 304, the process 300 performs offline synchronization between the encoder 210 and the decoder 240. Once the wireless receiver 200 is synchronized, the process 300 either move to the task block 306 or to the task block 308 depending upon the requirements of the wireless receiver 200.

If the process 300 moves to the task block 306, the process 300 performs the normal operation. That is, the wireless receiver 200 may perform its operation without any synchronization. However, if there is a requirement of the synchronization, the process 300 proceeds to the task block 308.

If the process 300 moves to the task block 308 either from the task block 304 or from the task block 306, the process 300 performs online synchronization between the encoder 210 and the decoder 240. Once the wireless receiver 200 is synchronized, the process 300 returns to the task block 306 to perform normal operation of the wireless receiver 200.

Returning to FIG. 3, the synchronization module 250 may be configured to perform an offline synchronization as well as online synchronization. Offline synchronization may be performed initially during power up stage and wireless receiver 200 is not receiving any input signals. To perform offline synchronization, the control module 252 may program the variable leading bit L value while activating the masking module 256. The masking module 256 may be configured to provide the encoder 210 with variable leading bit L only, while masking the remaining orthogonal codes as generated by variable leading bit orthogonal code set generator 254. However, the total duration of a searching window 414 (discussed below) associated with the codes may still remain the equal to the code length i.e. n+1.

Figure 11:
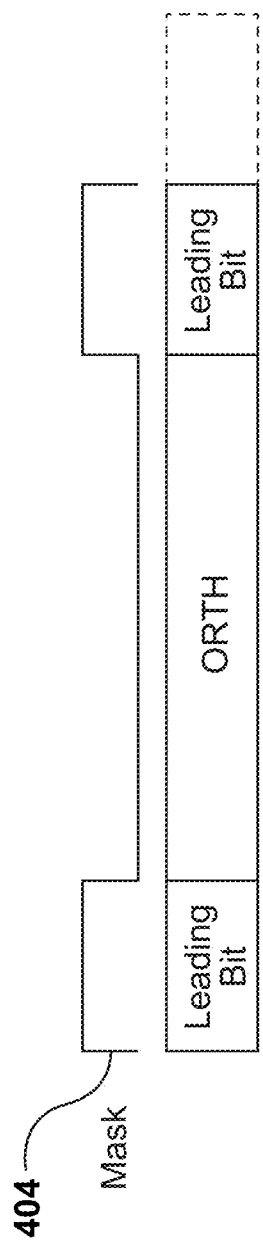
FIG. 11 illustrates a representative example of masking the orthogonal codes, in accordance with various embodiments of present disclosure.

FIG. 11 illustrates a representative example of masking the orthogonal codes, in accordance with various embodiments of present disclosure. As an example, the mask 402 may be of the format [1 0 0 0 . . . ] where the length of 0's may be equals to n. Going back to the FIG. 2, the encoder 210 may combine n variable leading bits having same values in such a manner that time duration between two variable leading bits may be equal to the duration of the orthogonal code and provides the combined n variable leading bits to the anti-aliasing filter 220. The anti-aliasing filter 220 attenuates the higher frequencies components and prevents the aliasing components from being sampled.

The filtered, combined n variable leading bits may then be supplied to the ADC 230, which operates to convert the filtered analog version of the combined n variable leading bits into a digital combined n variable leading bits. It is to be noted that the clock signal provided to the ADC 230 may be adjusted by the synchronization module 250. In particular, the delay module 260 may be configured to adjust the delay of the clock as provided by the clock generator 258 and provides a delay adjustment information to the ADC 230. The control module 252 may be configured to provide the amount of delay to be adjusted to the delay module 260. In certain embodiments, the amount of delay to be adjusted may be based on an integer factor or a fractional factor.

The output of ADC 230 may be supplied to the leading bit analyzer 262 for offline synchronization. The leading bit analyzer 262 may supply the digital combined n variable leading bits to the sample delay module 264. In certain embodiments, the sample delay module 264 may be configured to adjust the delay of the received digital combined n variable leading bits. In certain embodiments, the delay adjustments as provided by the sample delay module 264 may be based on an integer factor or a fractional factor. The sample delay module 264 may supply the adjusted digital combined n variable leading bits to the leading bit detector module 266. The leading bit detector module 266 may be configured to detect the variable leading bit L in the digital combined n variable leading bits. The leading bit detector module 266 may supply the detected bit to the power measurement module 268. The power measurement module 268 may be configured to measure the power of the detected bit and supply the measured power to the synchronization detector 270.

The synchronization detector 270 may be configured to compare the power associated with the detected bit to certain pre-defined threshold. In case the power associated with the detected bit is less than the pre-defined threshold, the synchronization detector 270 may provide the delay adjustment information to the control module 252. The control module 252 may provide the delay adjustment information to the delay module 260 to adjust the delay of the clock as provided by the clock generator 258. In return, the delay module 260 may provide the delay adjustment information to the ADC 230. The above steps are repeated until the power associated with the detected bit is more than the pre-defined threshold.

In case the power associated with the detected bit is more than the pre-defined threshold, the synchronization detector 270 may confirm the synchronization and provides the synchronization information to the control module 252 and to the decoder 240. The control module 252 may provide a control signal to the variable leading bit orthogonal code set generator 254. Based on the control signal, the variable leading bit orthogonal code set generator 254 may reprogram the variable leading bit L to the required value. Further, the control module 252 may also provide another control signal to the masking module 256. Based on the control signal, the masking module 256 may unmask the orthogonal codes in the variable leading bit orthogonal code set $c_i[n+1]$: $c_1[n+1], c_2[n+1], \ldots c_n[n+1]$. Thereby, the encoder 210 may now receive orthogonal codes with variable leading bit and the wireless receiver 200 may be operated under normal operation now.

In order to perform online synchronization, the control module 252 may program the variable leading bit L value above the normal value of the variable leading bit L. In this case, the masking module 256 may be configured to provide the encoder 210 with variable leading bit L as well as the remaining orthogonal codes as generated by variable leading bit orthogonal code set generator 254. The total duration of the searching window 414 (discussed below) associated with the codes may still remain the equal to the code length i.e. n+1.

Figure 12:
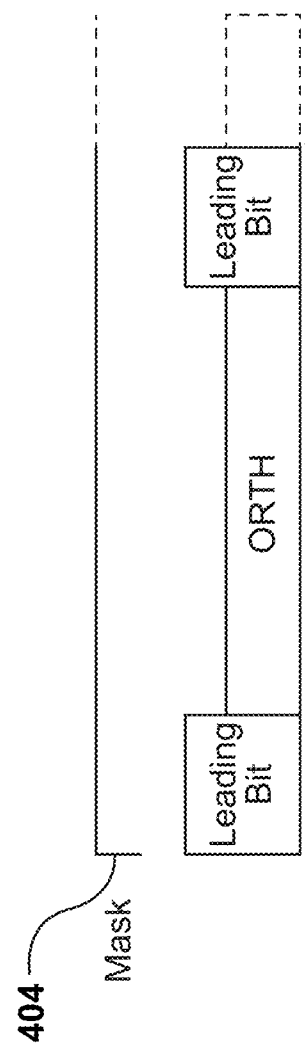
FIG. 12 illustrates a representative example of variable leading bit L value above the normal value of the variable leading bit L along with the orthogonal codes, in accordance with various embodiments of present disclosure.

FIG. 12 illustrates a representative example of variable leading bit L value above the normal value of the variable leading bit L along with the orthogonal codes, in accordance with various embodiments of present disclosure. As an example, the mask 404 may be of the format [1 1 1 . . . ] where the length of 1's may be equals to n+1. Going back to the FIG. 2, the encoder 210 may encode and convert the n analog input signals $x_1(t), x_2(t) \ldots x_n(t)$ into a single encoded analog composite signal y(t) by mixing the analog input signals $x_1(t), x_2(t) \ldots x_n(t)$ with the variable leading bit orthogonal code set as generated by the synchronization module 250.

The encoder 210 may provide the single encoded analog composite signal y(t) to the anti-aliasing filter 220. The anti-aliasing filter 220 attenuates the higher frequencies components and prevents the aliasing components from being sampled. The filtered, single encoded analog composite signal y'(t) as generated by the anti-aliasing filter 220 may then be supplied to the ADC 230, which operates to convert the filtered version of analog composite signal y'(t) into the digital composite signal y"(t).

It is to be noted that the clock signal provided to the ADC 230 may be adjusted by the synchronization module 250. In particular, the delay module 260 may be configured to adjust the delay of the clock as provided by the clock generator 258 and provides the delay adjustment information to the ADC 230. The control module 252 may be configured to provide the amount of delay to be adjusted to the delay module 260. In certain embodiments, the amount of delay to be adjusted may be based on an integer factor or a fractional factor.

The output of ADC 230 may be supplied to the leading bit analyzer 262 for online synchronization. The leading bit analyzer 262 may supply the single encoded digital composite signal y"(t) to the sample delay module 264. In certain embodiments, the sample delay module 264 may be configured to adjust the delay of the received single encoded digital composite signal y"(t). The delay adjustments as provided by the sample delay module 264 may be based on an integer factor or a fractional factor. The sample delay module 264 may supply the adjusted single encoded digital composite signal y"(t) to the leading bit detector module 266. The leading bit detector module 266 may be configured to detect the variable leading bit L in the single encoded digital composite signal y"(t). The leading bit detector module 266 may supply the detected bit to the power measurement module 268. The power measurement module 268 may be configured to measure the power of the detected bits and supply the measured power to the synchronization detector 270.

The synchronization detector 270 may be configured to compare the power associated with the detected bit to certain pre-defined threshold. In case the power associated with the detected bit is less than the pre-defined threshold, the synchronization detector 270 may provide the delay adjustment information to the control module 252. The control module 252 may provide the delay adjustment information to the delay module 260 to adjust the delay of the clock as provided by the clock generator 258. In return, the delay module 260 may provide the delay adjustment information to the ADC 230. The above steps are repeated until the power associated with the detected bit is more than the pre-defined threshold.

In case the power associated with the detected bit is more than the pre-defined threshold, the synchronization detector 270 may confirm the synchronization and provide the synchronization information to the control module 252 and to the decoder 240. The control module 252 may provide control signal to the variable leading bit orthogonal code set generator 254. Based on the control signal, the variable leading bit orthogonal code set generator 254 may reprogram the variable leading bit L to the required value. Thereby, the encoder 210 may now receive orthogonal codes with required variable leading bit L and the wireless receiver 200 may be operated under normal operation now.

Figure 13:
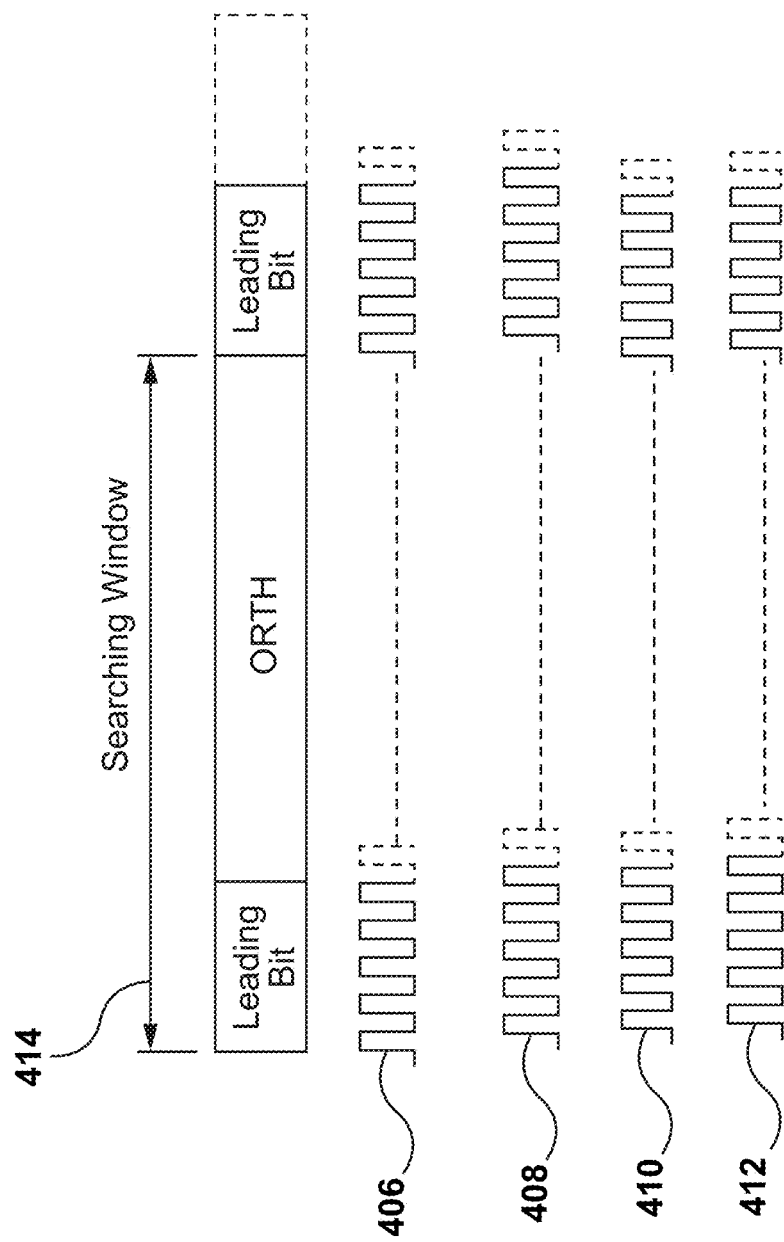
FIG. 13 illustrates representative example of delay adjustments provided to an analog to digital convertor (ADC) as well as to an output of the ADC, in accordance with various embodiments of present disclosure.

It is to be noted that the irrespective of offline synchronization or online synchronization, the delay adjustment as provided by the delay module 260 and by the sample delay module 264 may be based on an integer value or a fractional value. In certain embodiments the delay adjustment information may depend on the ratio of ADC clock rate and code rate and delay adjustment resolution. FIG. 13 illustrates representative example of delay adjustments provided by the delay module 260 to the ADC 230, and to the output of ADC by the sample delay module 264 to the received signals, in accordance with various embodiments of present disclosure.

As shown, 406 may correspond to an initial clock associated with the ADC 230. 408 may represent the delay adjusted clock associated with the ADC 230. As such, the delay adjusted clock 408 may correspond to the delay in the initial clock 406 and this delay can be a fractional delay or an integer delay. Similarly, 410 may correspond to an initial output of the ADC 230. 412 may represent the delay adjusted output of the ADC 230. As such, the delay adjusted output 412 may correspond to the delay in the initial output 410 and this delay can be a fractional delay or an integer delay. Also the delay adjustments associated with the output of ADC 230 may be performed to adjust the starting position of the searching window 414, where the searching window 414 may correspond to the duration during which the synchronization is being performed.

Figure 14:
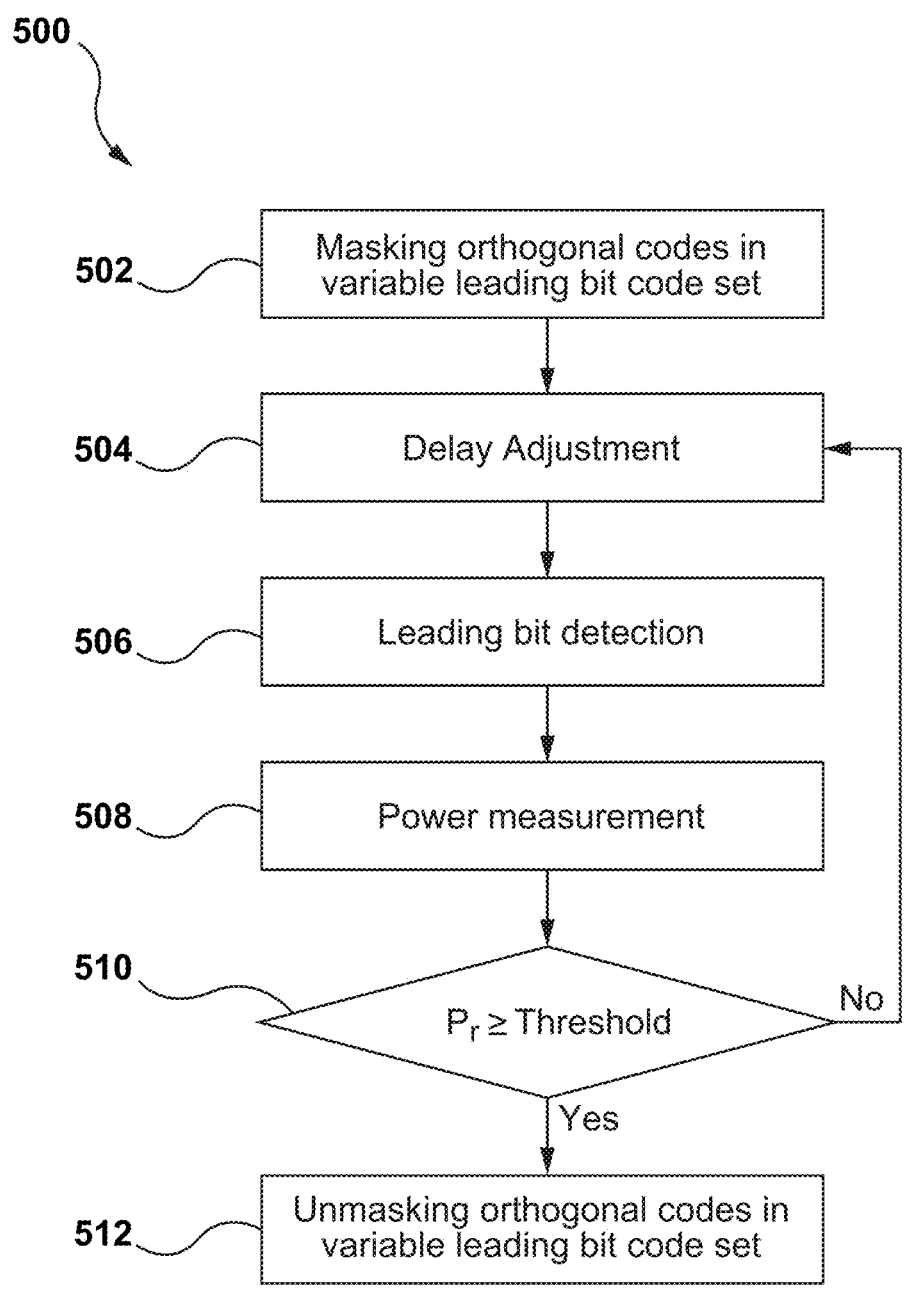
FIG. 14 illustrates representative flow diagram of a process directed to a method for performing offline synchronization in the wireless receiver, in accordance with various embodiments of present disclosure.

FIG. 14 illustrates representative flow diagram of a process 500 directed to a method for performing offline synchronization in the wireless receiver 200, in accordance with various embodiments of present disclosure. As shown, the process 500 commences at task block 502 where the wireless receiver 200 masks the orthogonal codes in the variable leading bit orthogonal code set $c_i[n+1]$. In Particular, the control module 252 may program the variable leading bit L value while activating the masking module 256. The masking module 256 may be configured to provide the encoder 210 with variable leading bit L only, while masking the remaining orthogonal codes as generated by variable leading bit orthogonal code set generator 254. However, the total duration of the searching window 414 associated with the codes may still remain the equal to the code length i.e. n+1.

The process 500 then advances to the task block 504. At task block 504, the wireless receiver 200 performs the delay adjustment on the combined n variable leading bits as supplied to the ADC 230 by the anti-aliasing filter 220. As noted above, the delay module 260 may be configured to adjust the delay of the clock as provided by the clock generator 258 and provides the delay adjustment information to the ADC 230. The control module 252 may be configured to provide the amount of delay to be adjusted to the delay module 260.

The process 500 then moves to the task block 506. At task block 506, the wireless receiver 200 performs leading bit detection. As discussed above, the leading bit detector module 266 may be configured to detect the variable leading bit L in the digital combined n variable leading bits. The process 500 then advances to the task block 508 where the receiver 200 performs power measurement. As previously discussed, the power measurement module 268 may be configured to measure the power of the detected bit and supply the measured power to the synchronization detector 270.

The process 500 then moves to the task block 510. At task block 510, the wireless receiver 200 compares the power associated with the detected bit with certain pre-defined threshold. If the power associated with the detected bit is less than the pre-defined threshold, the process 500 returns to task block 504. If the power associated with the detected bit is greater than the pre-defined threshold, the process 500 moves to task block 512. As noted previously, the synchronization detector 270 may be configured to compare the power associated with the detected bit to certain pre-defined threshold. In case the power associated with the detected bit is less than the pre-defined threshold, the synchronization detector 270 may provide delay adjustment information to the control module 252. In case the power associated with the detected bit is more than the pre-defined threshold, the synchronization detector 270 may confirm the synchronization.

Finally, at task block 512, the wireless receiver 200 unmask the orthogonal codes in the variable leading bit orthogonal code set $c_i[n+1]$ and the wireless receiver 200 returns to the normal operation. In particular, the synchronization detector 270 provides the synchronization information to the control module 252 and to the decoder 240. The control module 252 may provide a control signal to the variable leading bit orthogonal code set generator 254. Based on the control signal, the variable leading bit orthogonal code set generator 254 may reprogram the variable leading bit L to the required value. Further, the control module 252 may also provide another control signal to the masking module 256. Based on the control signal, the masking module 256 may unmask the orthogonal codes in the variable leading bit orthogonal code set $c_i[n+1]$: $c_1[n+1]$, $c_2[n+1]$, . . . $c_n[n+1]$. Thereby, the encoder 210 may now receive orthogonal codes with variable leading bit and the wireless receiver 200 may be operated under normal operation now.

Figure 15:
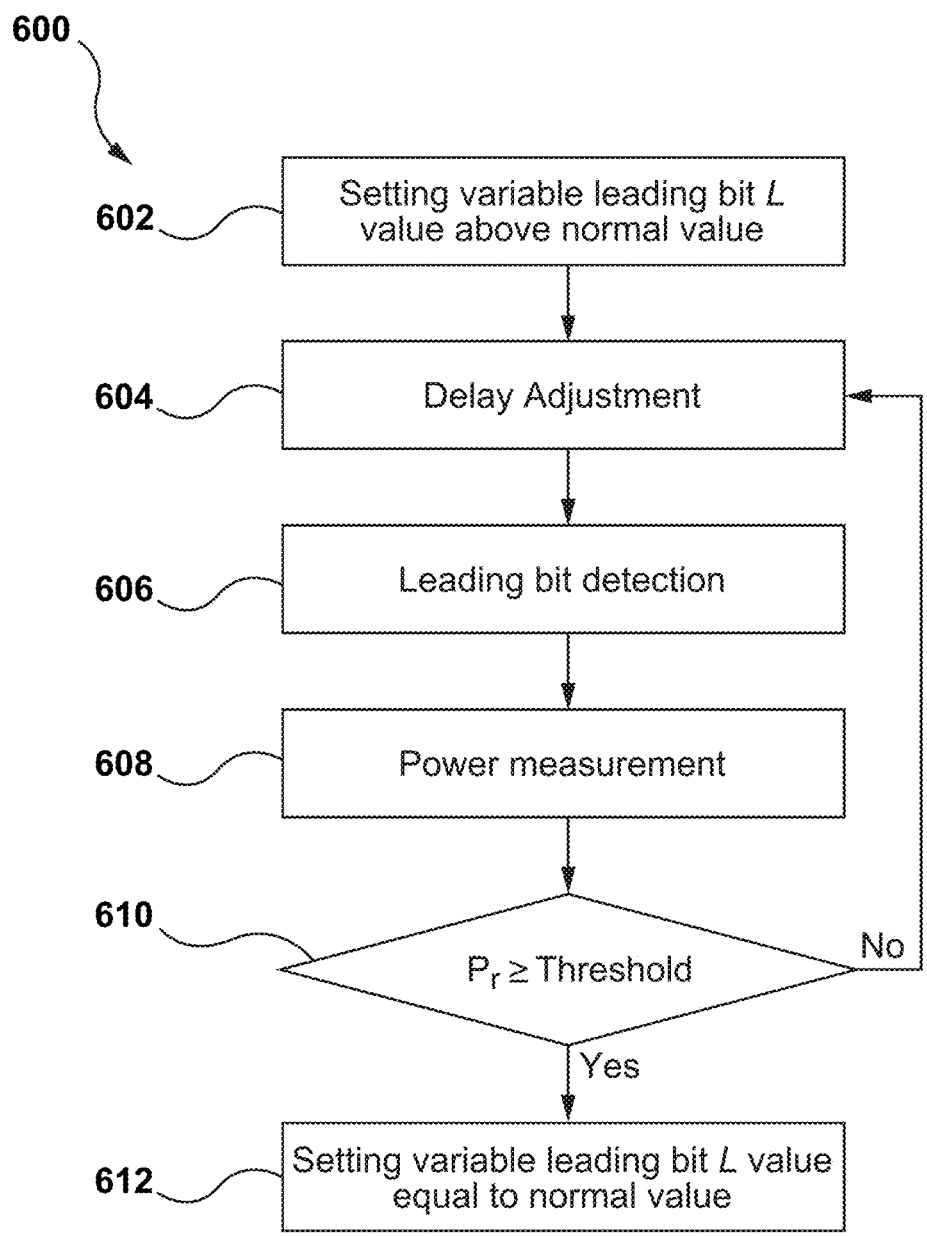
FIG. 15 illustrates representative flow diagram of a process directed to a method for performing online synchronization in the wireless receiver, in accordance with various embodiments of present disclosure.

FIG. 15 illustrates representative flow diagram of a process 600 directed to a method for performing online synchronization in the wireless receiver 200, in accordance with various embodiments of present disclosure. As shown, the process 600 begins at the task block 602 where the wireless receiver 200 sets variable leading bit L in the variable leading bit orthogonal code set $c_i[n+1]$ above the normal value. In Particular, the control module 252 may program the variable leading bit L value above the normal value of the variable leading bit L. In this case, the masking module 256 may be configured to provide the encoder 210 with variable leading bit L as well as the remaining orthogonal codes as generated by variable leading bit orthogonal code set generator 254. The total duration or searching window 414 associated with the codes may still remain the equal to the code length i.e. n+1.

The process 600 then advances to the task block 604. At task block 604, the wireless receiver 200 performs the delay adjustment on the single encoded analog composite signal y'(t) as supplied to the ADC 230 by the anti-aliasing filter 220. As noted above, the delay module 260 may be configured to adjust the delay of the clock as provided by the clock generator 258 and provides the delay adjustment information to the ADC 230. The control module 252 may be configured to provide the amount of delay to be adjusted to the delay module 260.

The process 600 then moves to the task block 606. At task block 606, the wireless receiver 200 performs leading bit detection. As discussed above, the leading bit detector module 266 may be configured to detect the variable leading bit L in the single encoded digital composite signal y"(t).

The process 600 then advances to the task block 608 where the receiver 200 performs power measurement. As previously discussed, the power measurement module 268 may be configured to measure the power of the detected bit and supply the measured power to the synchronization detector 270.

The process 608 then moves to the task block 610. At task block 610, the wireless receiver 200 compares the power associated with the detected bit with certain pre-defined threshold. If the power associated with the detected bit is less than the pre-defined threshold, the process 600 returns to task block 604. If the power associated with the detected bit is greater than the pre-defined threshold, the process 600 moves to task block 612. As noted previously, the synchronization detector 270 may be configured to compare the power associated with the detected bit to certain pre-defined threshold. In case the power associated with the detected bit is less than the pre-defined threshold, the synchronization detector 270 may provide delay adjustment information to the control module 252. In case the power associated with the detected bit is more than the pre-defined threshold, the synchronization detector 270 may confirm the synchronization.

Finally, at task block 612, the wireless receiver 200 sets the variable leading bit L to the normal value in the variable leading bit orthogonal code set $c_i[n+1]$ and the wireless receiver 200 returns to the normal operation. In particular, the synchronization detector 270 provides synchronization information to the control module 252 and to the decoder 240. The control module 252 may provide control signal to the variable leading bit orthogonal code set generator 254. Based on the control signal, the variable leading bit orthogonal code set generator 254 may reprogram the variable leading bit L to the required value. Thereby, the encoder 210 may now receive orthogonal codes with required variable leading bit L and the wireless receiver 200 may be operated under normal operation now.

Figure 16A:
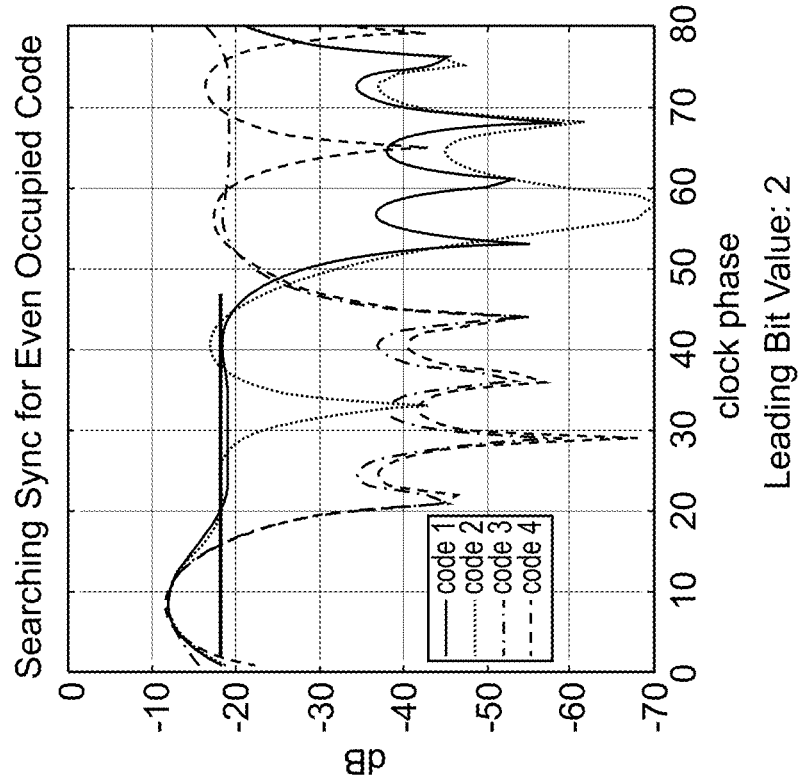
FIGS. 16A-16C illustrate representative simulation results for searching synchronization when input to the encoder are 4 signals, each having a frequency of 20 MHz, in accordance with various embodiments of present disclosure.
Figure 16B:
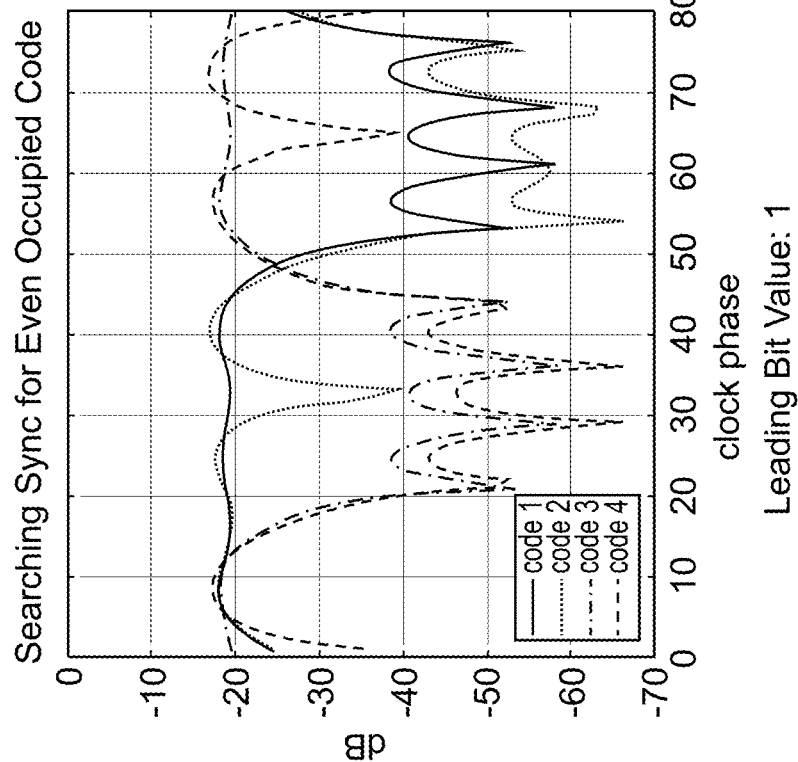
Figure 16C:
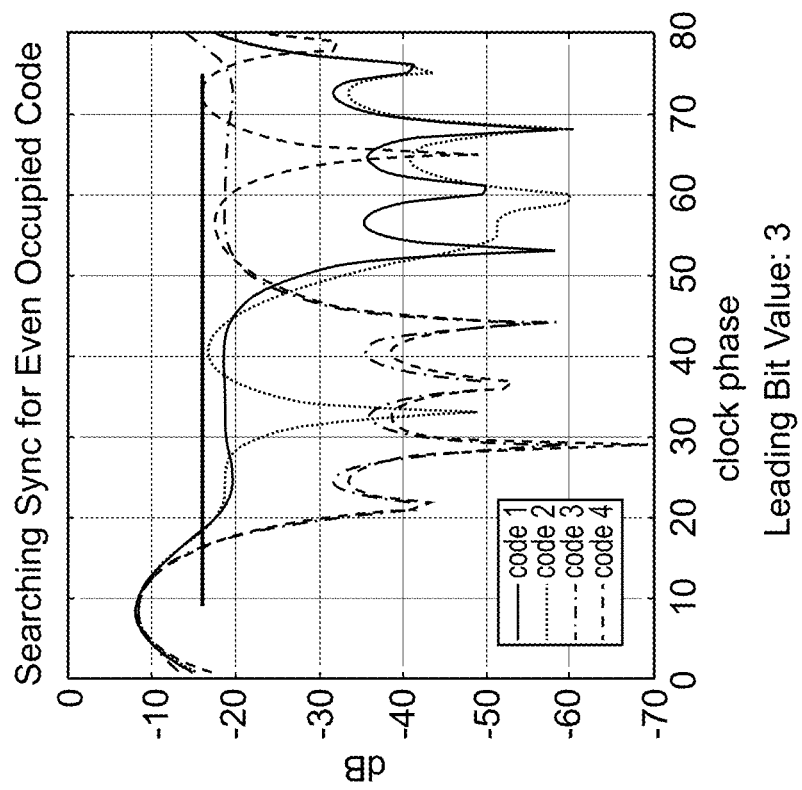

FIGS. 16A-16C illustrate representative simulation results for searching synchronization when input to the encoder 210 are 4 signals, each having a frequency of 20 MHz, in accordance with various embodiments of present disclosure. Further, the variable leading bit orthogonal code set $c_i[n+1]$ used in this case is based on even value of n. As shown, FIG. 16A illustrates searching synchronization for variable leading bit L equals to 1, FIG. 16B illustrates searching synchronization for variable leading bit L equals to 2, and FIG. 16C illustrates searching synchronization for variable leading bit L equals to 3. It has been observed in FIGS. 16A-16C that with increasing the value of variable leading bit L synchronization may be achieved more effectively.

Figures 17A, 17B:
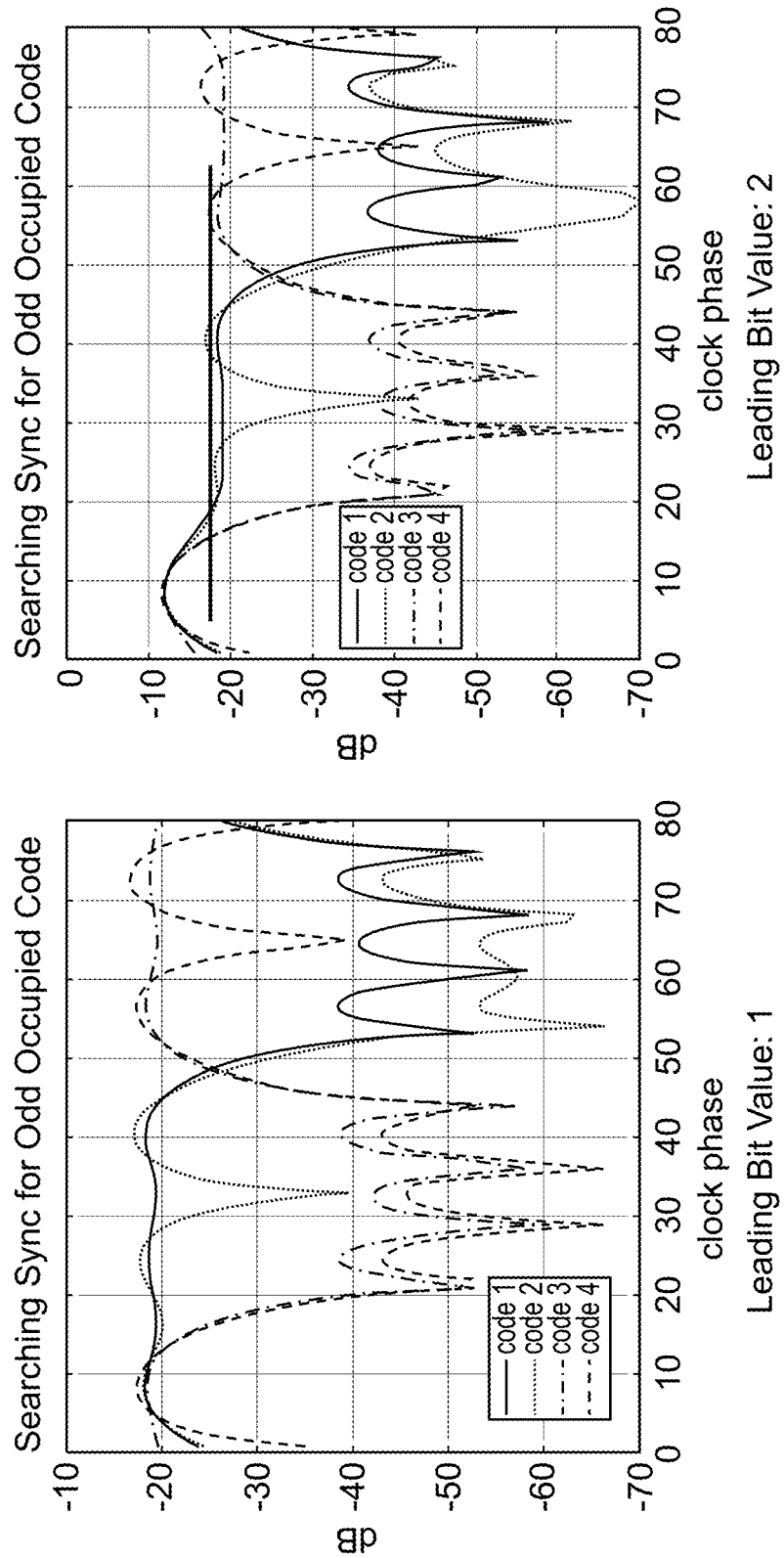
FIGS. 17A-17C illustrate representative simulation results for searching synchronization when input to the encoder are 4 signals, each having a frequency of 20 MHz, in accordance with various embodiments of present disclosure.
Figure 17C:
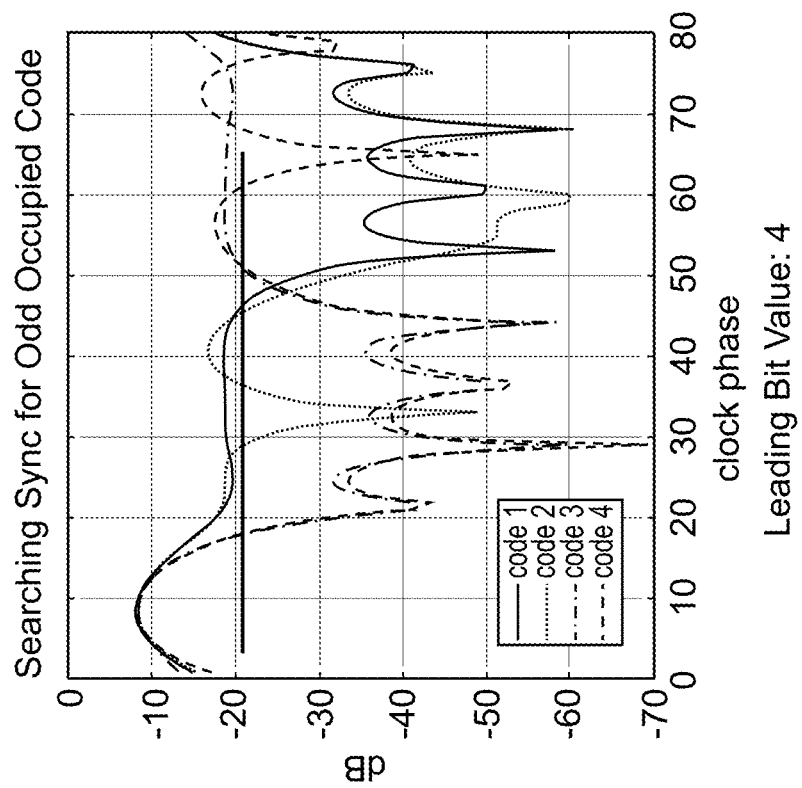

FIGS. 17A-17C illustrate another representative simulation results for searching synchronization when input to the encoder 210 are 4 signals, each having a frequency of 20 MHz, in accordance with various embodiments of present disclosure. Further, the variable leading bit orthogonal code set $c_i[n+1]$ used in this case is based on odd value of n. As shown, FIG. 17A illustrates searching synchronization for variable leading bit L equals to 1, FIG. 17B illustrates searching synchronization for variable leading bit L equals to 2, and FIG. 17C illustrates searching synchronization for variable leading bit L equals to 4. It has been observed in FIGS. 17A-17C that with increasing the value of variable leading bit L synchronization may be achieved more effectively.

Figure 18:
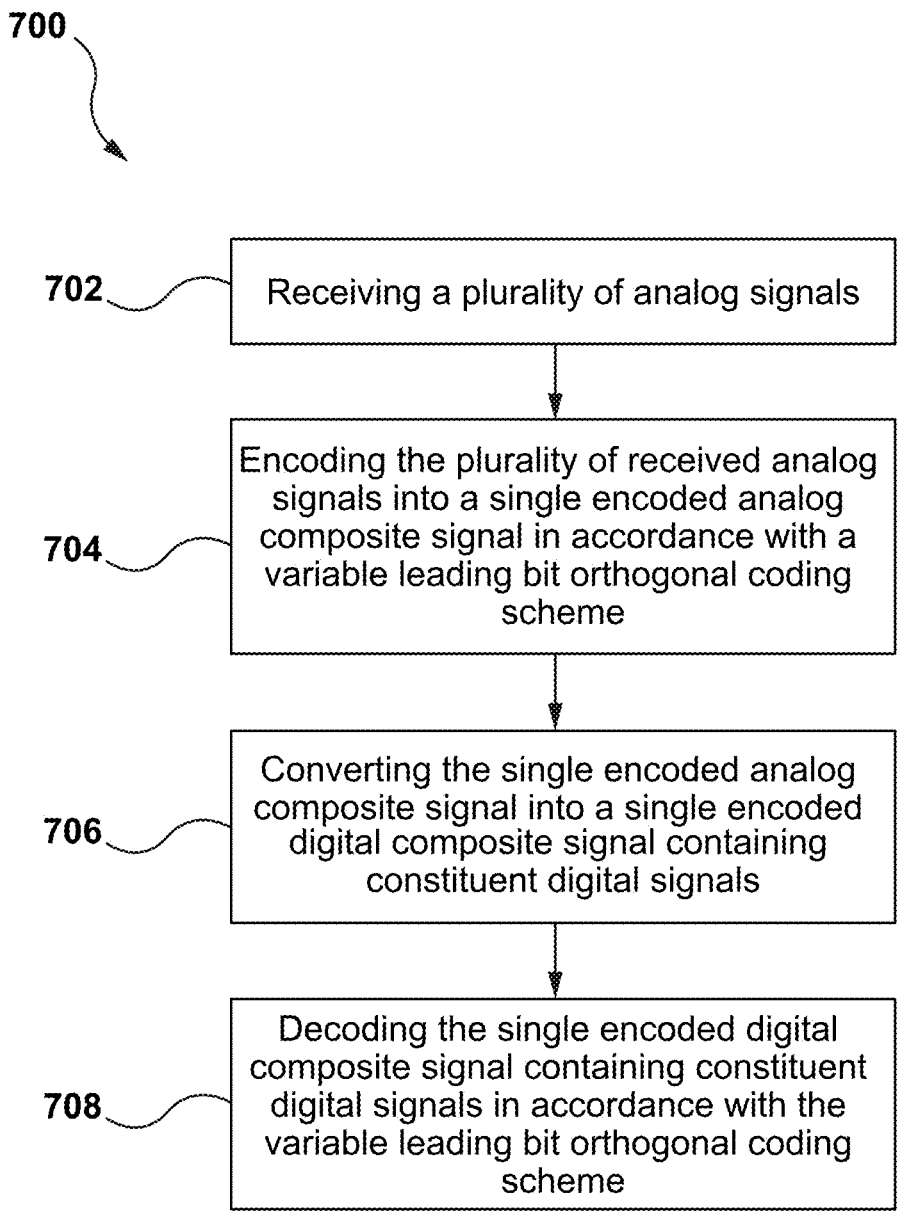
FIG. 18 depicts a flow diagram of a process directed to processing wireless received signals, in accordance with various embodiments of the present disclosure.

FIG. 18 depicts a flow diagram of process 700 directed to processing wireless received signals, in accordance with various embodiments of the present disclosure. As shown, the process 700 commences at task block 702 where the wireless receiver 200 receives a plurality of analog signals. As noted above, the wireless receiver 200 receives n analog input signals $x_1(t), x_2(t) \ldots x_n(t)$, which may be received by one or more antenna structures (not shown), such as, for example, MIMO/M-MIMO antennas.

The process 700 proceeds to task block 704, where the wireless receiver 200 encodes the plurality of received analog signals into a single encoded analog composite signal in accordance with a variable leading bit orthogonal coding scheme. As previously noted, the encoder 210 encodes and converts the n analog input signals $x_1(t), x_2(t) \ldots x_n(t)$ into a single encoded analog composite signal y(t). In particular, the encoding operation of encoder module 210 is accomplished by mixing the analog input signals $x_1(t), x_2(t) \ldots x_n(t)$ with the variable leading bit orthogonal code set $c_i[n+1]$: $c_1[n+1], c_2[n+1], \ldots c_n[n+1]$ as generated by the synchronization module 250. The outputs of the mixing operation may be subsequently combined to yield the single encoded analog composite signal y(t).

The process 700 then advances to the task block 706, where the wireless receiver 200 converts the single encoded analog composite signal into a single encoded digital composite signal containing constituent digital signals. As discussed above, the ADC 230, operates to convert the filtered version of analog composite signal y'(t) into a single encoded digital composite signal y"(t).

Finally, at task block 708, the wireless receiver 200 decodes the single encoded digital composite signal containing constituent digital signals in accordance with the variable leading bit orthogonal coding scheme, to output a plurality of digital signals containing the desired information content of the received plurality of analog signals. As noted above, the decoder module 240 processes the single encoded digital composite signal y"(t) to decode and separate the single encoded digital composite signal y"(t) into constituent n digital signals $x'_1(t), x'_2(t) \ldots x'_n(t)$ that encompass the desired information contained by the originally received n analog input signals.

It will be appreciated that the methods 500, 600 and 700 may also be performed by computer programs, which may exist in a variety of forms both active and inactive. Such as, the computer programs may exist as software program(s) comprised of program instructions in source code, object code, executable code or other formats. Any of the above may be embodied on a computer readable medium, which include storage devices and signals, in compressed or uncompressed form. Representative non-transitory computer readable storage devices include conventional computer system RAM (random access memory), ROM (read only memory), EPROM (erasable, programmable ROM), EEPROM (electrically erasable, programmable ROM), and magnetic or optical disks or tapes. Representative computer readable signals, whether modulated using a carrier or not, are signals that a computer system hosting or running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general.

Thus, by virtue of techniques provided by the wireless receiver 200, hardware/software processing speeds are reduced, lower-bandwidth resources may be implemented, power consumption is decreased and synchronization can be performed in a simplified manner.

It is to be understood that the operations and functionality of the he wireless receiver 200, constituent components, and associated processes may be achieved by one or more of the hardware-based, software-based, firmware-based elements combinations thereof. Such operational alternatives do not, in any way, limit the scope of the present disclosure.

It will also be understood that, although the inventive concepts and principles presented herein have been described with reference to specific features, structures, and embodiments, it is clear that various modifications and combinations may be made without departing from such disclosures. The specification and drawings are, accordingly, to be regarded simply as an illustration of the inventive concepts and principles as defined by the appended claims, and are contemplated to cover any and all modifications, variations, combinations or equivalents that fall within the scope of the present disclosure.

What is claimed is:

1. A method of processing wireless received signals, comprising:
   receiving a plurality of analog signals;
   encoding the plurality of received analog signals into a single encoded analog composite signal in accordance with a variable leading bit orthogonal coding scheme;
   converting the single encoded analog composite signal into a single encoded digital composite signal containing constituent digital signals; and
   decoding the single encoded digital composite signal containing constituent digital signals in accordance with the variable leading bit orthogonal coding scheme, to output a plurality of digital signals containing the desired information content of the received plurality of analog signals.

2. The wireless processing method of claim 1, wherein a leading bit in the variable leading bit orthogonal coding scheme is programmable.

3. The wireless processing method of claim 2, wherein except for the leading bit remaining variable leading bit orthogonal coding scheme is orthogonal in nature.

4. The wireless processing method of claim 3, further comprising performing offline synchronization.

5. The wireless processing method of claim 4, wherein performing the offline synchronization further comprises:
   masking the orthogonal codes in the variable leading bit orthogonal coding scheme;
   adjusting a delay of a clock signal for converting the single encoded analog composite signal into the single encoded digital composite signal;
   adjusting a delay of the single encoded digital composite signal;
   detecting the leading bit in the single encoded digital composite signal;
   measuring a power associated with the detected bit; and
      if the power associated with the detected bit is more than a pre-defined threshold, unmasking the orthogonal codes in the variable leading bit orthogonal coding scheme;
      if the power associated with the detected bit is less than the predefined threshold, again adjusting the delay of the clock signal and of the single encoded digital composite signal.

6. The wireless processing method of claim 5, wherein the delay adjustment of the clock signal is by a fractional factor.

7. The wireless processing method of claim 5, wherein the delay adjustment of the single encoded digital composite signal is by an integer factor.

8. The wireless processing method of claim 5, wherein the delay adjustment of the single encoded digital composite signal is by a fractional factor.

9. The wireless processing method of claim 3, further comprising performing an online synchronization.

10. The wireless processing method of claim 9, wherein performing the online synchronization further comprises:
    programming the leading bit value greater than the current value in the variable leading bit orthogonal coding scheme;
    adjusting a delay of a clock signal for converting the single encoded analog composite signal into the single encoded digital composite signal;
    adjusting a delay of the single encoded digital composite signal;
    detecting the leading bit in the single encoded digital composite signal;
    measuring a power associated with the detected bit; and
       if the power associated with the detected bit is more than a pre-defined threshold, reprogramming the leading bit value to the previous value in the variable leading bit orthogonal coding scheme;
       if the power associated with the detected bit is less than the predefined threshold, again adjusting the delay of the clock signal and of the single encoded digital composite signal.

11. The wireless processing method of claim 10, wherein the delay adjustment of the clock signal is by a fractional factor.

12. The wireless processing method of claim 10, wherein the delay adjustment of the single encoded digital composite signal is by an integer factor.

13. The wireless processing method of claim 10, wherein the delay adjustment of the single encoded digital composite signal is by a fractional factor.

14. A wireless receiver, comprising:
    a signal encoder configured to encode a plurality of received analog signals into a single encoded analog composite signal, in accordance with a variable leading bit orthogonal coding scheme;
    an analog-to-digital converter (ADC) configured to convert the single encoded analog composite signal into a single encoded digital composite signal containing constituent digital signals;
    a synchronization module configured to provide the variable leading bit orthogonal coding scheme to the signal encoder; and
    a signal decoder configured to decode the single encoded digital composite signal in accordance with the variable leading bit orthogonal coding scheme, to output a plurality of digital signals containing the desired information content of the received plurality of analog signals.

15. The wireless receiver of claim 14, wherein a leading bit in the variable leading bit orthogonal coding scheme is programmable.

16. The wireless receiver of claim 14, wherein except for the leading bit remaining variable leading bit orthogonal coding scheme is orthogonal in nature.

17. The wireless receiver of claim 14, wherein the synchronization module, further comprises:
    a variable leading bit orthogonal code set generator configured to generate the variable leading bit orthogonal coding scheme;

a control module configured to program the leading bit in the variable leading bit orthogonal coding scheme;

a delay module configured to adjust a delay of clock signal generated by a clock generator and provide the delay to the ADC, in accordance with input from the control module;

a masking module configured to mask the orthogonal codes in the variable leading bit orthogonal coding scheme; and a leading bit analyzer configured to detect and process the leading bit in the variable leading bit orthogonal coding scheme.

18. The wireless receiver of claim 17, wherein the control module is further configured to provide a code type and code rate to the variable leading bit orthogonal code set generator for generating the variable leading bit orthogonal coding scheme.

19. The wireless receiver of claim 17, further comprising performing offline synchronization.

20. The wireless receiver of claim 19, wherein performing the offline synchronization further comprises:

masking, by the masking module, the orthogonal codes in the variable leading bit orthogonal coding scheme;

adjusting, by the delay module, a delay of a clock signal for converting the single encoded analog composite signal into the single encoded digital composite signal;

adjusting, by the leading bit analyzer, a delay of the single encoded digital composite signal;

detecting, by the leading bit analyzer, the leading bit in the single encoded digital composite signal;

measuring, by the leading bit analyzer a power associated with the detected bit; and if the power associated with the detected bit is more than a pre-defined threshold, unmasking, by the masking module, the orthogonal codes in the variable leading bit orthogonal coding scheme;

if the power associated with the detected bit is less than the predefined threshold, again adjusting, by the delay module, the delay of the clock signal and again adjusting, by the leading bit analyzer, the delay of the single encoded digital composite signal.

21. The wireless receiver of claim 17, further comprising performing an online synchronization.

22. The wireless receiver of claim 21, wherein performing the online synchronization further comprises:

programming, by the control module, the leading bit value greater than the current value in the variable leading bit orthogonal coding scheme;

adjusting, by the delay module, a delay of a clock signal for converting the single encoded analog composite signal into a single encoded digital composite signal;

adjusting, by the leading bit analyzer, a delay of the single encoded digital composite signal;

detecting, by the leading bit analyzer, the leading bit in the single encoded digital composite signal;

measuring, by the leading bit analyzer a power associated with the detected bit; and if the power associated with the detected bit is more than a pre-defined threshold, unmasking, by the masking module, the orthogonal codes in the variable leading bit orthogonal coding scheme;

if the power associated with the detected bit is less than the predefined threshold, again adjusting, by the delay module, the delay of the clock signal and again adjusting, by the leading bit analyzer, the delay of the single encoded digital composite signal.

* * * * *